(12) United States Patent
Hashimoto et al.

(10) Patent No.: US 8,323,858 B2
(45) Date of Patent: Dec. 4, 2012

(54) PHOTOMASK BLANK, PHOTOMASK, AND METHODS OF MANUFACTURING THE SAME

(75) Inventors: Masahiro Hashimoto, Shinjuku-ku (JP); Hiroyuki Iwashita, Shinjuku-ku (JP); Atsushi Kominato, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/223,140

(22) Filed: Aug. 31, 2011

(65) Prior Publication Data

US 2011/0318674 A1 Dec. 29, 2011

Related U.S. Application Data

(62) Division of application No. 12/415,429, filed on Mar. 31, 2009, now Pat. No. 8,029,948.4

(30) Foreign Application Priority Data

Mar. 31, 2008 (JP) .................................. 2008-093517

(51) Int. Cl.
    *G03F 1/24* (2012.01)
(52) U.S. Cl. .......................................................... 430/5
(58) Field of Classification Search .............. 430/5, 322, 430/323, 394; 428/428, 430; 378/35
    See application file for complete search history.

(56) References Cited

U.S. PATENT DOCUMENTS

| 2002/0098422 A1 | 7/2002 | Nozawa |
| 2005/0277034 A1 | 12/2005 | Mitsui |
| 2007/0212618 A1 | 9/2007 | Yoshikawa et al. |
| 2007/0212619 A1 | 9/2007 | Yoshikawa et al. |
| 2007/0259276 A1 | 11/2007 | Yoshikawa et al. |
| 2010/0143831 A1 | 6/2010 | Yoshikawa et al. |

FOREIGN PATENT DOCUMENTS

| JP | 2002229183 A | 8/2002 |
| JP | 2005-345737 A | 12/2005 |
| JP | 2006-078825 A | 3/2006 |
| JP | 2006078807 A | 3/2006 |
| JP | 2007-241065 A | 9/2007 |
| JP | 2007-241136 A | 9/2007 |
| JP | 2007241060 A | 9/2007 |
| JP | 2007241137 A | 9/2007 |

OTHER PUBLICATIONS

Japanese Office Action corresponding to Japanese Patent Application No. 2008-093517, dated Jul. 18, 2012, English language translation.

*Primary Examiner* — Stephen Rosasco
(74) *Attorney, Agent, or Firm* — Sughrue Mion, PLLC

(57) ABSTRACT

A photomask blank has a light shieldable film formed on a light transmitting substrate. The light shieldable film has a light shielding layer which is formed of molybdenum silicide metal containing molybdenum in a content greater than 20 atomic % and not greater than 40 atomic % and which has a thickness smaller than 40 nm, an antireflection layer formed on the light shielding layer in contact with the light shielding layer and formed of a molybdenum silicide compound containing at least one of oxygen and nitrogen, and a low reflection layer formed under the light shielding layer in contact with the light shielding layer.

32 Claims, 10 Drawing Sheets

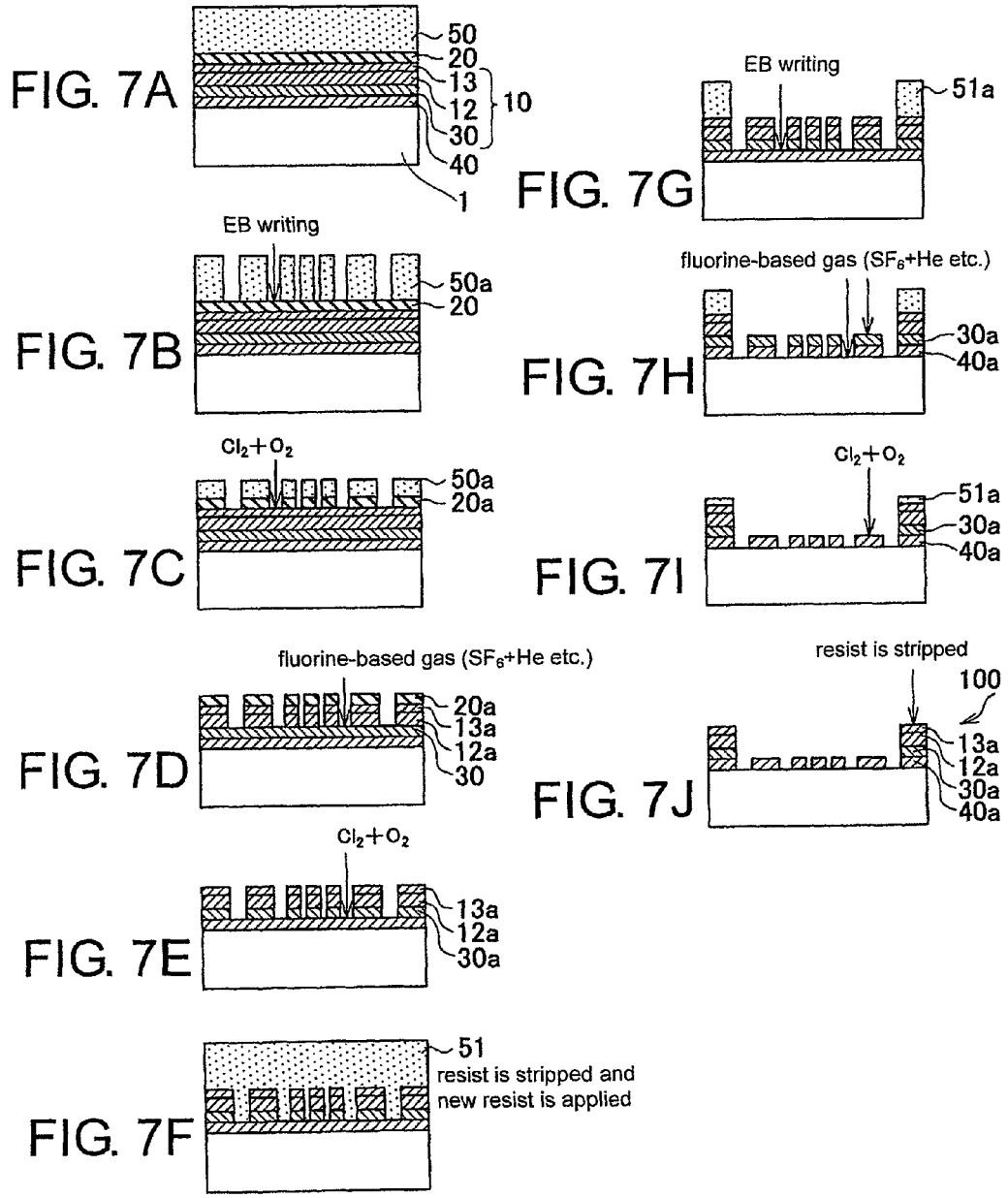

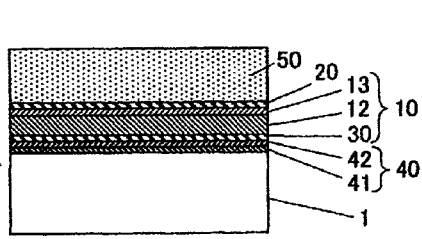
FIG. 8A
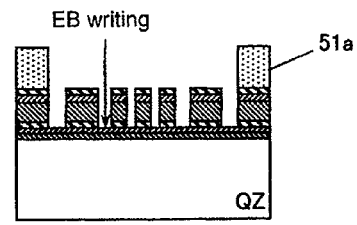
FIG. 8G
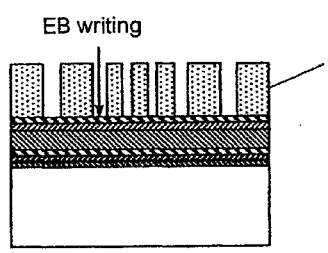
FIG. 8B
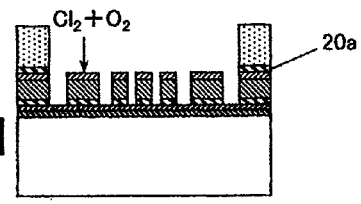
FIG. 8H
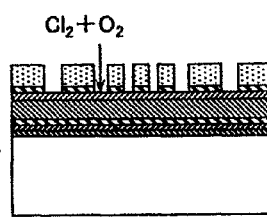
FIG. 8C
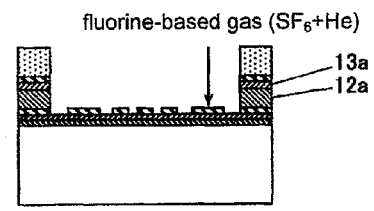
FIG. 8I
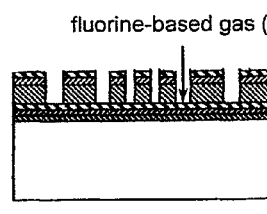
FIG. 8D
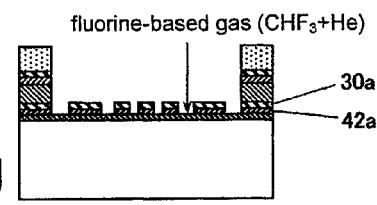
FIG. 8J
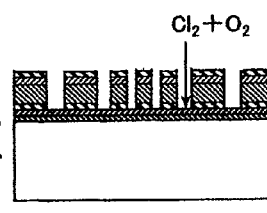
FIG. 8E
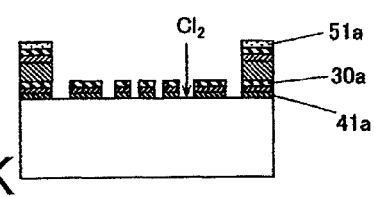
FIG. 8K
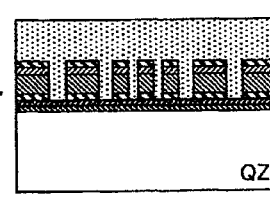
FIG. 8F
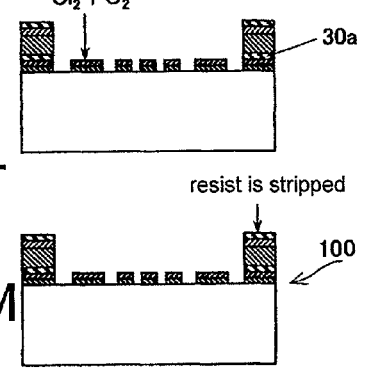
FIG. 8L
FIG. 8M Example 1: Range 0.86%    Wavelength 193nm Reference Example 1: Range 2.2%    Wavelength 193nm

PHOTOMASK BLANK, PHOTOMASK, AND METHODS OF MANUFACTURING THE SAME

This is a Divisional of application Ser. No. 12/415,429 filed Mar. 31, 2009, claiming priority based on Japanese Patent Application No. 2008-093517, filed on Mar. 31, 2008, the disclosure of which is incorporated herein by reference in its entirety.

TECHNICAL FIELD

This invention relates to a photomask blank and a photomask for use in manufacturing semiconductor devices and so on and to methods of manufacturing the same.

BACKGROUND ART

Miniaturization of semiconductor devices and so on has the advantage of achieving improvement in performance and function (high-speed operation, low power consumption, etc.) and reduction in cost and is increasingly accelerated. Such miniaturization is supported by the lithography technology. A transfer mask is one of key techniques, as well as an exposure apparatus and a resist material.

In recent years, development is made of the technology for a 45 nm to 32 nm half-pitch (hereinafter abbreviated to "hp") generation defined in the semiconductor design rule. The half pitch of 45 nm to 32 nm corresponds to ¼ to ⅙ of the wavelength of 193 nm of ArF excimer laser exposure light. In particular, in the 45 nm hp generation and beyond, only the application of the resolution enhancement technology (RET) such as conventional phase shift technique, oblique-incidence illumination, and pupil filtering, and the optical proximity correction (OPC) has become insufficient. Therefore, the hyper-NA (numerical aperture) technique (immersion lithography) and the double exposure (double patterning) are required.

In the phase shift technique, a predetermined phase difference is given to exposure light transmitted through a phase shift portion. By using the effect of interference of light, a resolution of a transfer pattern is improved.

As a photomask improved in resolution by the phase shift technique, a substrate dug-down type is known in which a quartz substrate is dug down by etching or the like to form a phase shift portion. Also known is another type in which a phase shift film formed on a substrate is patterned to form a phase shift portion.

As the photomask of a substrate dug-down type, there are known a Levenson-type phase shift mask, an enhancer-type phase shift mask, a chromeless phase shift mask, and so on. The chromeless phase shift mask is classified into a type in which a light shielding layer on a line is completely removed and another type (so-called zebra type) in which a light shielding layer on a line is patterned. The Levenson-type phase shift mask or the chromeless phase shift mask of a type in which a light shielding layer in a transfer region is completely removed may be called an alternative phase shifter. In the phase shift mask of this type, 100% of exposure light is transmitted through a phase shift portion. The enhancer-type phase shift mask has a light shielding portion, a transmittance control portion (phase shift of 360°=0°), and a 180° shift portion formed by digging down a glass substrate. In any of the above-mentioned types, a light shielding zone must be formed in a peripheral region (outer peripheral region) along four sides of the photomask (reticle).

As the photomask of the type in which a phase shift portion is formed by patterning a phase shift film formed on a substrate, a halftone phase shift mask or the like is known.

SUMMARY OF THE INVENTION

As a photomask blank for use in manufacturing the chromeless phase shift mask mentioned above, there is known a photomask blank having a CrO/Cr light shielding film (light-shieldable film) formed on a transparent substrate and comprising a lamination of a Cr light shielding layer and a CrO uppermost low reflection layer (antireflection layer). The light shielding film has a total thickness of 70 to 100 nm (see paragraph [0005] of JP-A-2007-241136 (Patent Document 1)). A manufacturing process of the chromeless phase shift mask is as follows. A substrate is dug down using a light shielding film pattern as an etching mask and a resist pattern used in formation of the light shielding film pattern is removed. Thereafter, a resist is applied again and exposure and development are performed to protect a part of a light shielding film which is to be left unremoved. Then, an unnecessary part of the light shielding film is removed by etching. As a result, the photomask is obtained which has a light shielding zone in an outer peripheral region of the substrate and, if necessary, a light shielding pattern in a transfer region. Thus, the light shielding film has both a function as an etching mask (may be called a hard mask) and another function as a light shielding layer for forming a light shielding zone or a light shielding pattern.

Generally, in order to improve CD (Critical Dimension) performance of a photomask, it is effective to reduce a thickness of each of a light shielding film and a resist for use in forming the light shielding film. However, if the light shielding film is reduced in thickness, an OD (Optical Density) value is decreased. In order to achieve the OD value of 3 generally required, the CrO/Cr light shielding film mentioned above must have the total thickness of about 60 nm at minimum. Therefore, substantial reduction in thickness is difficult. If the light shielding film can not be reduced in thickness, the resist can not be reduced in thickness because of an etching selectivity between the light shielding film and the resist. Accordingly, substantial improvement in CD performance can not be expected.

In order to solve the above-mentioned problem, a method disclosed in Patent Document 1 is proposed. The disclosed method uses a mask blank comprising a substrate, a Cr-based second etching mask film, an MoSi-based light shielding film, and a Cr-based first etching mask film (also serving as an antireflection film) (see paragraph [0038] in Patent Document 1) successively laminated in this order. By using the Cr-based second etching mask film reduced in thickness, the substrate is dug down with high accuracy (see paragraph [0039] in Patent Document 1). Furthermore, by using the Cr-based first etching mask film reduced in thickness, it is possible to reduce the thickness of the resist so as to improve the CD accuracy of the light shielding film (see paragraphs [0049] and [0035] of Patent Document 1). Simultaneously, it is assured that the light shielding film has an OD value of 3 (see paragraph [0046] in Patent Document 1).

However, the above-mentioned method intends to improve the CD performance by forming the light shielding film and the etching mask film as separate films of different materials and using, as an etching mask for the light shielding film, the etching mask film which has a very small thickness and a high etching selectivity as compared with the resist. Thus, the light shielding film itself is not reduced in thickness.

Furthermore, the above-mentioned method does not achieve an improvement in heat treatment resistance of the light shielding film, chemical resistance (mask cleaning resistance) of the light shielding film, a film stress of each layer such as the light shielding film and the etching mask film, flatness variation of the substrate before and after manufacture of the photomask (pattern position accuracy), and so on.

Unless the light shielding film itself is reduced in thickness and the above-mentioned improvement is achieved, the photomask is not applicable to ultrahigh NA-ArF lithography and double patterning. In order to obtain a necessary resolution (SRAF (Sub-Resolution Assist Feature) resolutions of 60 nm and 42 nm are required for hp 45 nm and hp 32 nm, respectively: from ITRS (International Technology Roadmap for Semiconductors) 2006) and necessary CD accuracy, it is desired to obtain a light shielding film which can be processed with a resist thickness of 200 nm or less, preferably 150 nm or less. However, it is difficult to provide a photomask blank and a photomask with a practical quality.

The above also applies, for example, to a photomask blank comprising a substrate, an MoSi-based phase shift film, a Cr-based second etching mask film, an MoSi-based light shielding film, and a Cr-based first etching mask film (also serving as an antireflection film) successively laminated in this order (see paragraph [0174] of JP-A-2007-241065 (Patent Document 2)).

The above also applies, for example, to a so-called binary photomask comprising a light shielding film having a laminated structure of an MoSi-based material, for example, a laminated structure of an MoSiN primary light shielding layer and an MoSiON antireflection layer successively laminated in this order from a substrate side (see JP-A-2006-78825 (Patent Document 3)).

In the meanwhile, in order to form a fine pattern having a DRAM half-pitch (hp) of 45 nm and beyond in the semiconductor design rule, it is necessary to use an ultrahigh-NA exposure method with a numerical aperture NA greater than 1 (NA>1), for example, immersion exposure.

The immersion exposure is an exposure method in which a gap between a wafer and a lowermost lens of an exposure apparatus is filled with a liquid. In the immersion exposure, as compared with the case where the gap is filled with air having the refractive index of 1, NA is increased in proportion to a refractive index of the liquid so that the resolution is improved. The numerical aperture NA is given by NA=n×sin θ where θ represents an angle between an optical axis and an outermost light beam incident to the lowermost lens of the exposure apparatus (maximum incidence angle) and n represents a refractive index of a medium between the wafer and the lowermost lens of the exposure apparatus.

However, in case where a fine pattern having a DRAM half-pitch (hp) of 45 nm and beyond in the semiconductor design rule is formed using the immersion exposure with the numerical aperture NA greater than 1 (NA>1), it has been found that the resolution and the CD accuracy (including the linearity) as expected can not be obtained.

The reason is as follows. When a pattern width of a mask pattern is smaller than an exposure wavelength, in case where an incident angle to a photomask (an angle formed by a normal of a substrate and incident light) is small (in case of near normal incidence), exit angles of ±first-order diffracted light beams emitted from the photomask are great so that the ±first-order diffracted light beams are no longer incident to a lens having a finite diameter. In this event, the mask pattern is not resolved. In order to avoid the above-mentioned problem, the incident angle to the photomask is increased (oblique incidence). Then, the exit angles of the ±first-order diffracted light beams emitted from the photomask become small and the ±first-order diffracted light beams are incident to the lens having a finite diameter. Therefore, the mask pattern is resolved.

However, if the incident angle to the photomask is increased, there arises a problem of shadowing which adversely affects the resolution. Specifically, as illustrated in FIG. 13, it is assumed that exposure light EL is obliquely incident to a sidewall of a light shielding pattern 130. In this event, a shadow is formed due to a three-dimensional structure (in particular, height) of the light shielding pattern. Because of presence of the shadow, the size of the mask pattern on the photomask can not accurately be transferred and the amount of light is reduced (illuminance is lowered).

As described above, when a pattern is transferred to an object such as a wafer by using a photomask produced from a mask blank, reduction in width of the pattern results in a problem of decrease in resolution due to the height of the sidewall of the pattern. In order to solve the above-mentioned problem, a transfer pattern must be reduced in thickness. Therefore, it is necessary to reduce the thickness of the light shielding film.

However, each of the methods described in Patent Documents 1 to 3 intends to improve the CD performance by forming the light shielding film and the etching mask film as separate films of different materials and using, as an etching mask for the light shielding film, the etching mask film which has a very small thickness and a high etching selectivity as compared with the resist. Thus, the light shielding film itself is not reduced in thickness. Therefore, reduction in thickness of the transfer pattern is insufficient.

Accordingly, it is difficult to provide a photomask blank and a photomask which are capable of achieving reduction in thickness of the light shielding film (consequently, reduction in thickness of the transfer pattern) as required for 45 nm DRAM half-pitch (hp) generation and beyond, in particular, 32 to 22 nm hp generation in the semiconductor design rule.

It is an object of this invention to develop a material of a generation aimed at a resist thickness of 200 nm or less (generally 45 nm hp or beyond), furthermore, a resist thickness of 150 nm or less (generally 32 nm hp or beyond).

It is another object of this invention to achieve reduction in thickness of a light shielding film, which is adaptable to an ultrahigh NA technique and double patterning as required for 45 nm DRAM half-pitch (hp) generation and beyond, in particular, 32 to 22 nm hp generation in the semiconductor design rule.

It is still another object of this invention to provide a photomask blank which is capable of achieving a resolution of 50 nm or less of a pattern on a mask.

This invention has following structures.

(Structure 1)

A photomask blank which is for use in manufacturing a photomask for ArF excimer laser exposure and which comprises a light transmitting substrate and a light shieldable film formed on the light transmitting substrate, wherein the light shieldable film comprises:

a light shielding layer which is formed of molybdenum silicide metal having a molybdenum content greater than 20 atomic % and not greater than 40 atomic % and which has a thickness smaller than 40 nm;

an antireflection layer formed on the light shielding layer in contact with the light shielding layer and comprising a molybdenum silicide compound containing at lease one of oxygen and nitrogen; and a low reflection layer formed under the light shielding layer in contact with the light shielding layer.

(Structure 2)

The photomask blank according to structure 1, wherein the antireflection layer contains molybdenum in a content greater than 0 atomic % and not greater than 10 atomic %.

(Structure 3)

The photomask blank according to structure 1 or 2, further comprising an etching mask film formed on the light shieldable film in contact with the light shieldable film and formed of a material containing chromium as a main component.

(Structure 4)

The photomask blank according to structure 3, wherein the etching mask film is formed of a material containing one of chromium nitride, chromium oxide, chromium oxynitride, and chromium oxycarbonitride as a main component.

(Structure 5)

The photomask blank according to any one of structures 1 to 4, wherein the low reflection layer is formed of a molybdenum silicide compound containing at least one of oxygen and nitrogen.

(Structure 6)

The photomask blank according to any one of structures 1 to 4, which is for use in manufacturing a phase shift mask comprising a light transmitting substrate provided with a phase shift portion for giving a predetermined phase difference to exposure light transmitted through the phase shift portion, wherein:

the phase shift portion is a dug-down portion formed by digging the light transmitting substrate from its one surface as a dug-down surface to a depth such that the predetermined phase difference is produced with respect to exposure light transmitted through the light transmitting substrate in an area without the phase shift portion; and the low reflection layer is formed of a material having an etching selectivity for an etching gas used in digging the light transmitting substrate by dry etching and is formed in contact with the dug-down surface of the light transmitting substrate.

(Structure 7)

The photomask blank according to any one of structures 1 to 4, which is for use in manufacturing a phase shift mask comprising a light transmitting substrate provided with a phase shift portion for giving a predetermined phase difference to exposure light transmitted through the phase shift portion, wherein:

the phase shift portion is a phase shift film for giving a predetermined amount of phase shift to exposure light transmitted through the phase shift portion; and the low reflection layer is formed of a material having an etching selectivity for an etching gas used in dry etching the phase shift film and is formed in contact with a surface of the phase shift film.

(Structure 8)

The photomask blank according to structure 6 or 7, wherein the low reflection layer is formed of a material containing one of chromium, chromium nitride, chromium oxide, chromium oxynitride, chromium oxycarbonitride, tantalum-hafnium, tantalum-zirconium as a main component.

(Structure 9)

A photomask manufactured by using the photomask blank according to any one of structures 1 to 8.

(Structure 10)

A method of manufacturing a photomask by using the photomask blank according to any one of structures 1 to 8.

According to this invention, it is possible to provide a photomask blank and a photomask each of which has a practical quality required in a generation aimed at a resist thickness of 200 nm or less, furthermore, a resist thickness of 150 nm or less.

According to this invention, it is also possible to provide a photomask blank and a photomask which are capable of achieving reduction in thickness of a primary light-shieldable film (consequently, reduction in thickness of a transfer pattern) to be adaptable to an ultrahigh NA technique and double patterning as required for a 45 nm DRAM half-pitch (hp) generation or beyond, in particular, 32-22 nm hp generation in the semiconductor design rule.

According to this invention, it is also possible to provide a photomask blank and a photomask which are capable of achieving a resolution of 50 nm or less of a pattern on a mask.

BRIEF DESCRIPTION OF THE DRAWING

FIGS. 7A to 7J are schematic sectional views for describing a manufacturing process of a photomask according to the third example of this invention;

FIGS. 8A to 8M are schematic sectional views for describing a manufacturing process of a photomask according to the fourth example of this invention;

DESCRIPTION OF THE EXEMPLARY EMBODIMENT

Now, this invention will be described in detail.

A photomask blank according to this invention is for use in manufacturing a photomask for ArF excimer laser exposure and comprises a light transmitting substrate and a light shieldable film formed on the light transmitting substrate. The light shieldable film comprises a light shielding layer which is formed of molybdenum silicide metal having a molybdenum content greater than 20 atomic % and not greater than 40 atomic % and which has a thickness smaller than 40 nm; an antireflection layer formed on the light shielding layer in contact with the light shielding layer and comprising a molybdenum silicide compound containing at lease one of oxygen and nitrogen; and a low reflection layer formed under the light shielding layer in contact with the light shielding layer (Structure 1).

Figure 14:
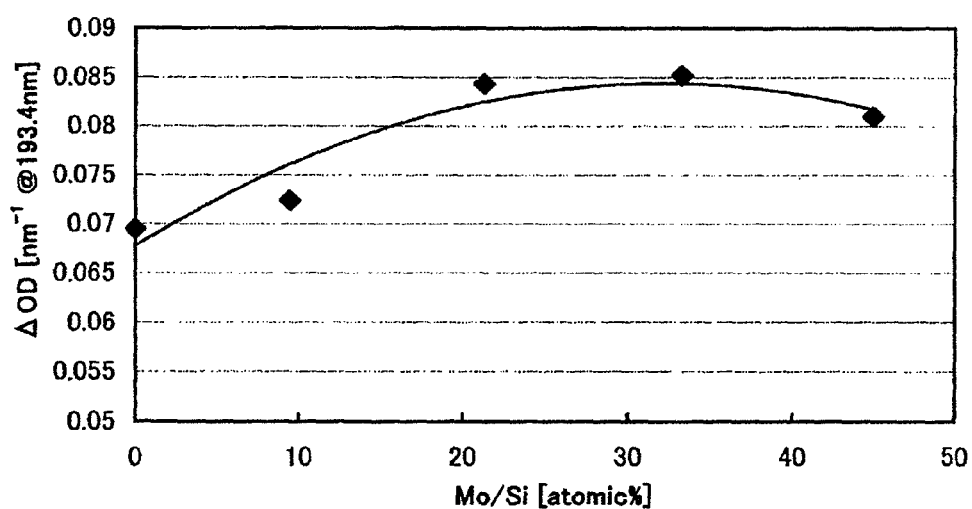
FIG. 14 is a view showing a relationship between a molybdenum content ratio in a molybdenum silicide metal thin film and an optical density per unit thickness.

The present inventor has found that the light shielding layer formed of molybdenum silicide metal and having a molybdenum content greater than 20 atomic % and not greater than 40 atomic % has a relatively large light shieldability for exposure light emitted by an ArF excimer laser as compared with a composition (having a molybdenum content not greater than 20 atomic % or greater than 40 atomic %) out of the above-mentioned range as shown in FIG. 14; that a predetermined light shieldability (optical density) is obtained when the light shielding layer has a thickness smaller than 40 nm which is substantially smaller than a conventional thickness; and that, by combining the light shielding layer with an antireflection layer and a low reflection layer having a light shieldability equivalent to a conventional level, a light shieldability sufficient for a light shieldable film of a photomask for ArF excimer laser exposure is obtained. Based on these findings, the invention of the structure 1 has been completed.

According to the invention of the structure 1, following effects are obtained.

(1) By reduction in thickness of the light shieldable film (reduction in thickness of a transfer pattern), following effects are obtained.

1) Pattern collapse during mask cleaning is prevented.

2) As a result of reduction in thickness of the light shieldable film, the height of a sidewall of a mask pattern is reduced. Therefore, pattern accuracy particularly in a sidewall height direction is improved so as to enhance the CD accuracy (in particular, linearity).

3) Particularly for a photomask used in a high NA (immersion) generation, it is required to reduce the thickness of the mask pattern (to lower the height of the sidewall of the mask pattern) in order to prevent shadowing. This requirement is met.

(2) When the Mo content of the light shielding layer falls within the range of this invention, following effects are obtained.

1) As compared with a composition out of the range of this invention, a relatively high etching rate is achieved during dry etching using a fluorine-based gas.

In this invention, the light shielding layer formed of molybdenum silicide metal means a light shielding layer substantially comprising molybdenum and silicon (metallic film substantially free from oxygen and nitrogen). "Substantially free from oxygen and nitrogen" means that oxygen and nitrogen are contained within a range allowing the effects of this invention to be obtained (the content of each of oxygen and nitrogen being less than 5 at % of the total content of components of the light shielding layer). In view of light shielding performance, it is preferable that oxygen and nitrogen are not contained in the light shielding layer. However, oxygen and nitrogen are often mixed as impurities during a film forming process or a photomask manufacturing process. Therefore, oxygen and nitrogen are allowed to be contained within a range such that no substantial influence is given to light shielding performance.

In this invention, the light shielding layer formed of molybdenum silicide metal may contain other element or elements (carbon, helium, hydrogen, argon, xenon, and so on) within a range such that the characteristics and effects mentioned above are not impaired.

In this invention, the light shielding layer desirably has a thickness not smaller than 30 nm and smaller than 40 nm, more desirably 33 nm to 38 nm.

The photomask blank according to this invention is characterized in that the antireflection layer contains molybdenum in a content greater than O atomic % and not greater than 10 atomic % (Structure 2).

The present inventor has found that, by combining the light shielding layer having a relatively high Mo content and the antireflection layer having a relatively low Mo content, a layer structure of the light shieldable film meeting the requirements in optical characteristics and chemical resistance is obtained. Based on the finding, the invention of the structure 2 has been completed.

According to the invention of the structure 2, following effects are obtained.

(1) When the Mo content of the antireflection layer falls within the range of this invention, following effects are obtained.

1) As compared with a composition out of the range of this invention, chemical resistance (cleaning resistance) of the antireflection layer is relatively excellent.

2) As compared with a composition out of the range of this invention, heat treatment resistance of the antireflection layer is relatively excellent.

Specifically, the antireflection layer according to the structure 2 is prevented from clouding caused by heat treatment and degradation in surface reflectance distribution.

In this invention, as a material of the antireflection layer formed of a molybdenum silicide compound containing at least one of oxygen and nitrogen, use may be made of MoSiON, MoSiO, MoSiN, MoSiOC, and MoSiOCN. Among others, MoSiO and MoSiON are preferable in view of chemical resistance and heat resistance and MoSiON is preferable in view of defect quality of mask blanks.

In this invention, if MoSiON, MoSiO, MoSiN, MoSiOC, MoSiOCN, or the like as the antireflection layer contains a greater content of Mo, the cleaning resistance, in particular, the resistance against alkali (ammonia water or the like) or hot water is decreased. In view of the above, in MoSiON, MoSiO, MoSiN, MoSiOC, MoSiOCN, or the like as the antireflection layer, the content of Mo is preferably as small as possible.

When heat treatment (annealing) is carried out at high temperature for the purpose of stress control, inclusion of a greater content of Mo causes a phenomenon that a film surface is clouded. This is presumably because MoO is deposited on the surface. In order to avoid occurrence of the above-mentioned phenomenon, it is preferable that, in MoSiON, MoSiO, MoSiN, MoSiOC, MoSiOCN, or the like as the antireflection layer, the content of Mo in the antireflection layer is less than 10 atomic %. However, if the content of Mo is excessively small, abnormal discharge during DC sputtering is prominent and the frequency of occurrence of defects is increased. Therefore, it is desired that Mo is contained within a range such that sputtering is normally carried out. Depending on a deposition technique, film formation may be carried out without containing Mo.

In this invention, the antireflection layer desirably has a thickness of 5 nm to 15 nm, more desirably 8 nm to 12 nm.

In this invention, a film stress of the MoSi light shielding layer is freely controllable to be a tensile stress or a compressive stress by adjusting an Ar gas pressure, an He gas pressure, and heat treatment conditions. For example, by controlling the film stress of the MoSi light shielding layer to be the tensile stress, a compressive stress of the antireflection layer (for example, MoSiON) is balanced with the tensile stress of the MoSi light shielding layer. Thus, the stresses of the respective layers forming the light shieldable film cancel each other so that a total film stress of the light shieldable film is minimized (substantially equal to zero).

On the other hand, if the light shielding layer is MoSiN, the film stress of MoSiN is compressive so that stress control of the light shielding layer is difficult. Therefore, it is difficult to establish the balance with the compressive stress of the antireflection layer (for example, MoSiON).

In this invention, the photomask blank preferably has an etching mask film formed on the light shieldable film in contact with the light shieldable film and formed of a material containing chromium as a main component (Structure 3). With this structure, reduction in thickness of the resist is achieved.

In this invention, the etching mask film is preferably formed of a material containing one of chromium nitride, chromium oxide, chromium oxynitride, and chromium oxycarbonitride as a main component (Structure 4). These materials have a high etching selectivity with respect to the antireflection layer or the light shielding layer which is formed under the etching mask film in contact with the etching mask film and which is formed of a molybdenum silicide compound. Therefore, the etching mask film which has become unnecessary can be removed without damaging other layers.

In this invention, the etching mask film may be formed by the use of a material such as elemental chromium or a combination of chromium and at least one element selected from oxygen, nitrogen, carbon, and hydrogen (Cr-containing material). As a film structure of the etching mask film, a single layer of the above-mentioned film material is often used. Alternatively, a multilayer structure may be used. The multilayer structure may be a multilayer structure having stepwise different compositions or a film structure having a continuous varying composition.

Among others, chromium oxycarbonitride (CrOCN) is preferable as the material of the etching mask film in view of stress controllability (low stress film can be formed).

In this invention, the etching mask film preferably has a thickness of 5 nm to 30 nm.

In this invention, the low reflection layer (back-surface antireflection layer) is formed of a molybdenum silicide compound containing at least one of oxygen and nitrogen (Structure 5). With this structure, it is possible to prevent reflection on a back surface of the light shieldable film (on the side adjacent to a light transmitting substrate). If the low reflection layer and the light shielding layer are formed by the use of targets having the same content ratio of Mo and Si, formation is easily carried out at a low cost. Furthermore, the low reflection layer and the light shielding layer formed as mentioned above have the same content ratio of Mo and Si so that etching rates of these layers are equal to each other. Therefore, formation of these layers using the targets having the same content ratio of Mo and Si is preferable in view of improvement of accuracy in the direction of the sidewall (section) of the pattern of the light shieldable film.

The photomask blank according to this invention is for use in manufacturing a phase shift mask comprising a light transmitting substrate provided with a phase shift portion for giving a predetermined phase difference to exposure light transmitted through the phase shift portion. Preferably, the phase shift portion is a dug-down portion formed by digging the light transmitting substrate from its one surface as a dug-down surface to a depth such that the predetermined phase difference is produced with respect to exposure light transmitted through the light transmitting substrate in an area without the phase shift portion, and the low reflection layer is formed of a material having an etching selectivity for an etching gas used in digging the light transmitting substrate by dry etching and is formed in contact with the dug-down surface of the light transmitting substrate (Structure 6).

By forming the low reflection layer using the material having an etching selectivity for the etching gas such as a fluorine-based gas used in dry etching of the light transmitting substrate, the low reflection layer also serves as an etching mask when the light transmitting substrate is dug down. With this structure, it is possible to improve the accuracy of processing the phase shift portion formed by digging down the light transmitting substrate.

With the above-mentioned structure 6, it is possible to provide a photomask blank having a phase shift portion of a substrate dug-down type, which has a practical quality required in a generation aimed at a resist thickness of 200 nm or less, furthermore, a resist thickness of 150 nm or less.

The photomask blank according to this invention is for use in manufacturing a phase shift mask comprising a light transmitting substrate provided with a phase shift portion for giving a predetermined phase difference to exposure light transmitted through the phase shift portion. Preferably, the phase shift portion is a phase shift film for giving a predetermined amount of phase shift to exposure light transmitted through the phase shift portion, and the low reflection layer is formed of a material having an etching selectivity for an etching gas used in dry etching the phase shift film and is formed in contact with a surface of the phase shift film (Structure 7).

By forming the low reflection layer using the material having an etching selectivity for the etching gas such as a fluorine-based gas used in dry etching of the light transmitting substrate, the low reflection layer also serves as an etching mask when the light transmitting substrate is dug down. With this structure, it is possible to improve the accuracy of processing the phase shift portion formed by digging down the light transmitting substrate. Furthermore, by forming the low reflection layer using the material having an etching selectivity for the etching gas such as a fluorine-based gas used in dry etching of the phase shift film, it is possible to improve the processing accuracy of the phase shift portion formed by processing the phase shift film.

With the above-mentioned structure 7, it is possible to provide a photomask blank having a phase shift portion formed by processing a phase shift film, which has a practical quality required in a generation aimed at a resist thickness of 200 nm or less, furthermore, a resist thickness of 150 nm or less.

In this invention, the phase shift film may be formed of a material containing, as a main component, any one of molybdenum silicide, molybdenum silicide nitride, molybdenum silicide oxide, molybdenum silicide oxynitride, and molybdenum silicide oxycarbonitride. With this structure, it is possible to obtain a halftone phase shift mask having a transmittance of about 2% to 20% with respect to the wavelength of 193 nm of ArF excimer laser exposure light.

In this invention, the phase shift mask may comprise a laminated structure of a phase adjusting layer and a transmittance adjusting layer. With this structure, it is possible, for example, to obtain a halftone phase shift mask of a high transmittance type without digging down the substrate.

Herein, as a material of the transmittance adjusting layer, use may be made of a film formed of one kind of material or two or more kinds of materials selected from metal and silicon, or a film formed of oxide, nitride, oxynitride, or carbide thereof. Specifically, as the material of the transmittance adjusting layer, use may be made of a film formed of one kind of material or two or more kinds of materials selected from aluminum, titanium, vanadium, chromium, zirconium, niobium, molybdenum, lanthanum, tantalum, tungsten, silicon, and hafnium, or a film formed of nitride, oxide, oxynitride, or carbide thereof. As the phase adjusting layer, a silicon-based thin film formed of silicon oxide, silicon nitride, silicon oxynitride, or the like is preferable because a relatively high transmittance is readily obtained with respect to exposure light in an ultraviolet region.

In this invention, the phase shift film may comprise a phase adjusting layer formed of a material containing silicon oxide or silicon oxynitride as a main component and a transmittance adjusting layer containing tantalum or a tantalum-hafnium alloy as a main component.

In this invention, the low reflection layer is preferably formed of a material containing one of chromium, chromium nitride, chromium oxide, chromium oxynitride, chromium oxycarbonitride, tantalum-hafnium, tantalum-zirconium as a main component (Structure 8). This is because the processing accuracy is excellent. Furthermore, the above-mentioned materials have a high etching selectivity with respect to those layers formed on and under the low reflection layer in contact with the low reflection layer so that the etching mask film which has become unnecessary can be removed without damaging other layers.

In this invention, the low reflection layer may be formed by the use of a material such as elemental chromium or a combination of chromium and at least one kind of element selected from oxygen, nitrogen, carbon, and hydrogen (Cr-containing material). As a film structure of the etching mask film, a single layer of the above-mentioned film material is often used. Alternatively, a multilayer structure may be used. The multilayer structure may be a multilayer structure having stepwise different compositions or a film structure having a continuous varying composition.

The low reflection layer may be formed of a material containing tantalum-hafnium or tantalum-zirconium as a main component. These materials are dry etched with a chlorine-based gas substantially free from oxygen but are not substantially dry etched with a fluorine-based gas. Thus, these materials have an etching selectivity with respect to the antireflection layer, the light shielding layer, and the light transmitting substrate which are etched with the fluorine-based gas.

Among others, chromium oxycarbonitride (CrOCN) is particularly preferable as the material of the low reflection layer in view of stress control. In view of readily canceling the film stress between the low reflection layer and the light shielding layer or the antireflection layer as an upper layer, chromium nitride (CrN) is preferable also. Furthermore, in case of the photomask blank having the phase shift film, the function as the etching mask (etching selectivity) is particularly important rather than an antireflection function. In view of the etching selectivity, chromium nitride (CrN) is particularly preferable.

In this invention, the low reflection layer preferably has a thickness of 10 nm to 30 nm.

A photomask according to this invention is manufactured by the use of the above-mentioned photomask blank according to this invention (Structure 9).

Thus, in the photomask also, the effects similar to those described in connection with the structures 1 to 8 are obtained.

A method of manufacturing a photomask according to this invention uses the above-mentioned photomask blank according to this invention (Structure 10).

Thus, also in the method of manufacturing a photomask, the effects similar to those described in connection with the structures 1 to 8 are obtained.

In this invention, dry etching of the chromium-based thin film is preferably carried out using a dry etching gas comprising a chlorine-based gas or a mixed gas containing a chlorine-based gas and an oxygen gas. The reason is as follows. For the chromium-based thin film formed of a material containing chromium and other element or elements such as oxygen and nitrogen, it is possible to increase a dry etching rate, to shorten a dry etching time, and to form a light shieldable film pattern having an excellent cross-sectional shape by carrying out dry etching using the above-mentioned dry etching gas. For example, the chlorine-based gas used as the dry etching gas may be $Cl_2$, $SiCl_4$, HCl, $CCl_4$, $CHCl_3$, or the like.

In this invention, in order to dig down the light transmitting substrate or to carry out dry etching of a silicon-containing film or a metal silicide-based thin film, use may be made of a fluorine-based gas such as $SF_6$, $CF_4$, $C_2F_6$, and $CHF_3$, a mixed gas of the fluorine-based gas and He, $H_2$, $N_2$, Ar, $C_2H_4$, $O_2$, or the like, a chlorine-based gas such as $Cl_2$, $CH_2Cl_2$, or a mixed gas of the chlorine-based gas and He, $H_2$, $N_2$, Ar, $C_2H_4$, or the like.

In this invention, the light transmitting substrate may be a synthetic quartz substrate, a $CaF_2$ substrate, a soda lime substrate, an alkali-free glass substrate, a low-thermal-expansion glass substrate, an aluminoquartzte glass substrate, or the like.

In this invention, the photomask blank includes a phase shift mask blank, a binary photomask blank without using a phase shift effect, and an imprint mask blank. The photomask blank also includes a mask blank with a resist film.

In this invention, the photomask includes a phase shift mask and a binary photomask without using a phase shift effect. The photomask includes a reticle. The phase shift mask includes the case where the phase shift portion is formed by digging down the substrate.

Hereinafter, examples of this invention and comparative examples will be described. In the examples and the comparative examples, each of the light shieldable film, the etching mask film, and the phase shift film is formed by using sputtering as a film forming technique and a DC magnetron sputtering apparatus as a sputtering apparatus. However, upon embodying this invention, a sputtering apparatus of another type, such as an RF magnetron sputtering apparatus, may be used without being limited to the film forming technique and the sputtering apparatus mentioned above.

Example 1

Manufacture of Photomask Blank

Figure 1:
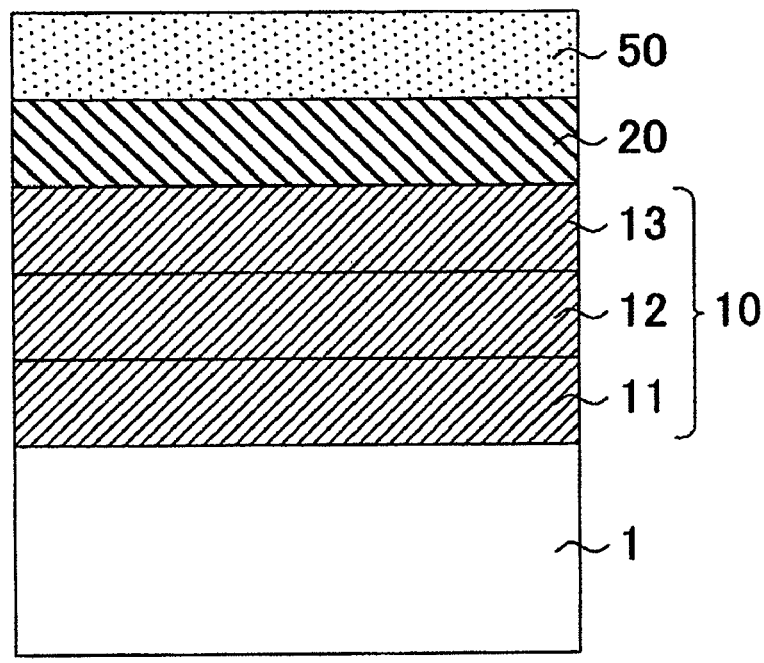
FIG. 1 is a schematic sectional view of a photomask blank according to a first example of this invention.

Referring to FIG. 1, description will be made of manufacture of a photomask blank according to Example 1 of the present invention. In FIG. 1, a synthetic quartz substrate having a size of 6 inch square and a thickness of 0.25 inch was used as a light transmitting substrate 1. On the light transmitting substrate 1, an MoSiON film 11 (low reflection layer), an MoSi film (light shielding layer) 12, and an MoSiON film (antireflection layer) 13 were formed as a light shieldable film 10.

In detail, using a target of Mo:Si=21:79 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 21:79) was formed to a thickness of 7 nm. Then, using the same target, a sputtering gas of Ar at a pressure of 0.1 Pa, and a DC power supply of 2.0 kW, a film comprising molybdenum and silicon (MoSi film:

atomic % ratio of Mo and Si in the film being about 21:79) was formed to a thickness of 35 nm. Then, using a target of Mo:Si=4:96 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 4:96) was formed to a thickness of 10 nm. The total thickness of the light shieldable film 10 was 52 nm. The light shieldable film 10 had an optical density (OD) of 3 at the wavelength of 193 nm of ArF excimer laser exposure light.

Next, the above-mentioned substrate was heat treated (annealed) at 400° C. for 30 minutes.

Then, on the light shieldable film 10, an etching mask film 20 was formed (FIG. 1). Specifically, using a chromium target, a sputtering gas of a mixture of Ar, $CO_2$, $N_2$, and He at a pressure of 0.2 Pa (gas flow rate ratio Ar:$CO_2$:$N_2$:He=21:37:11:31), and a DC power supply of 1.8 kW, a CrOCN film was formed as the etching mask film 20 to a thickness of 15 nm. At this time, by annealing the CrOCN film at a temperature lower than an annealing temperature of the above-mentioned MoSi light shieldable film, a film stress of the CrOCN film was controlled to be minimized (preferably, substantially equal to zero) without affecting a film stress of the MoSi light shieldable film.

As described above, the photomask blank provided with the light shieldable film for ArF excimer laser exposure was obtained.

(Manufacture of Photomask)

Figure 5A:
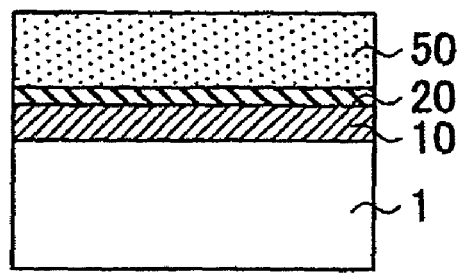
FIGS. 5A to 5E are schematic sectional views for describing a manufacturing process of a photomask according to the first example of this invention.

Referring to FIGS. 5A to 5E in addition, manufacture of a photomask according to Example 1 will be described. On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 1, FIG. 5A).

Figure 5B:
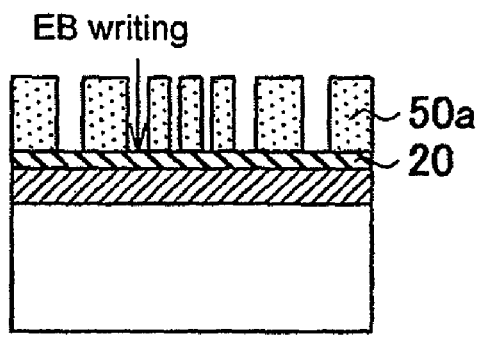

Next, the resist film 50 was subjected to writing of a desired pattern by the use of an electron beam lithography apparatus and thereafter developed with a predetermined developer to form a resist pattern 50a (FIG. 5B).

Figure 5C:
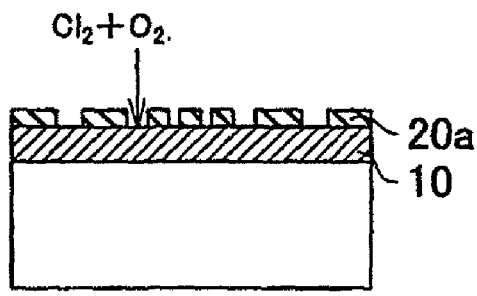

Then, using the resist pattern 50a as a mask, the etching mask film 20 was dry etched to form an etching mask film pattern 20a (FIG. 5C). As a dry etching gas, a mixed gas of $Cl_2$ and $O_2$ ($Cl_2$:$O_2$=4:1) was used.

Then, the residual resist pattern 50a was peeled and removed by a chemical solution.

Figure 5D:
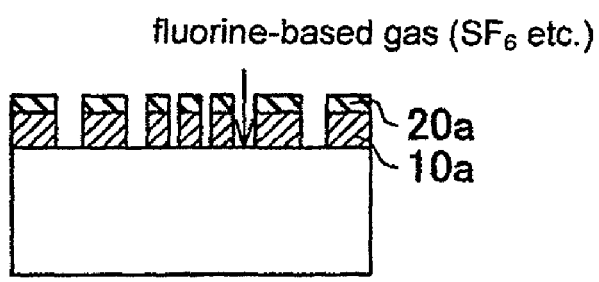
Figure 5E:
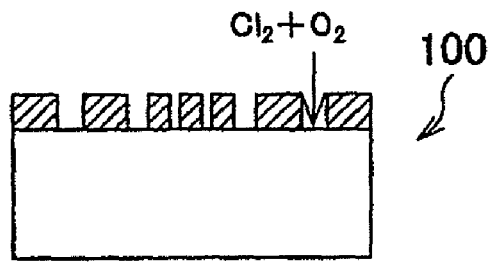

Then, using the etching mask film pattern 20a as a mask, the light shieldable film 10 was dry etched using a mixed gas of $SF_6$ and He to form a light shieldable film pattern 10a (FIG. 5D).

Next, the etching mask film pattern 20a was peeled by dry etching using a mixed gas of $Cl_2$ and $O_2$ (FIG. 5E) and predetermined cleaning was carried out to obtain the photomask 100.

In the above-mentioned example of manufacturing the photomask, the resist pattern 50a was peeled and removed after the etching mask film pattern 20a was formed. The reason is as follows. When the light shieldable film pattern 10a is formed in the light shieldable film 10 in the next process, it is preferable that the height of the sidewall of the mask pattern (=the height of the sidewall of the etching mask film pattern 20a) is lower because higher CD accuracy, smaller microloading, and more excellent processing accuracy are achieved. In case of manufacturing a photomask which is not required to have more excellent processing accuracy or in case where the etching mask film is desired to have an antireflection function for the exposure light, the resist pattern 50a may be peeled and removed after the light shieldable film pattern 10a is formed.

Reference Example 1

Manufacture of Photomask Blank

Figure 10:
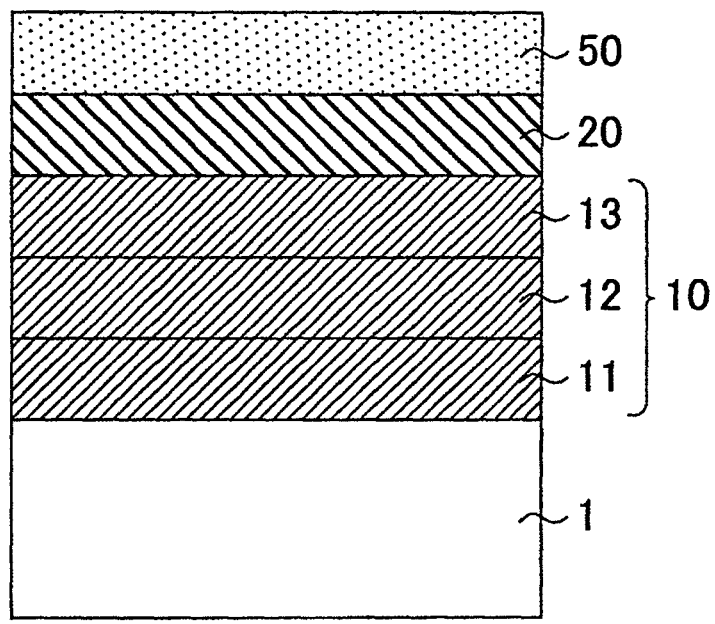
FIG. 10 is a schematic sectional view showing a photomask blank according to a reference example 1.

Referring to FIG. 10, description will be made of manufacture of a photomask blank according to Reference Example 1. In FIG. 10, a synthetic quartz substrate having a size of 6 inch square and a thickness of 0.25 inch was used as a light transmitting substrate 1. On the light transmitting substrate 1, an MoSiON film 11 (low reflection layer), an MoSi film (light shielding layer) 12, and an MoSiON film (antireflection layer) 13 were formed as a light shieldable film 10.

In detail, using a target of Mo:Si=21:79 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 21:79) was formed to a thickness of 7 nm. Then, using the same target, a sputtering gas of Ar at a pressure of 0.1 Pa, and a DC power supply of 2.0 kW, a film comprising molybdenum and silicon (MoSi film: atomic % ratio of Mo and Si in the film being about 21:79) was formed to a thickness of 35 nm. Then, using the same target, a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film: atomic % ratio of Mo and Si in the film being about 21:79) was formed to a thickness of 10 nm. The total thickness of the light shieldable film 10 was 52 nm. The light shieldable film 10 had an optical density (OD) of 3 at the wavelength of 193 nm of ArF excimer laser exposure light.

Next, the above-mentioned substrate was heat treated (annealed) at 400° C. for 30 minutes.

Then, on the light shieldable film 10, an etching mask film 20 was formed (FIG. 10). Specifically, using a chromium target, a sputtering gas of $N_2$ at a pressure of 0.2 Pa, and a DC power supply of 1.8 kW, a CrN film was formed as the etching mask film 20 to a thickness of 15 nm.

As described above, the photomask blank provided with the light shieldable film for ArF excimer laser exposure was obtained.

Reference Example 1 illustrated in FIG. 10 is similar to Example 1 illustrated in FIG. 1 except that the atomic % ratio of Mo and Si in the MoSiON film (antireflection layer) 13 is changed from about 4:96 to about 21:79 and the etching mask film 20 is changed from CrOCN to CrN.

(Manufacture of Photomask)

Referring to FIGS. 5A to 5E used in describing Example 1, manufacture of a photomask according to Reference Example 1 will be described.

On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 10, FIG. 5A).

Next, the resist film 50 was subjected to writing of a desired pattern by the use of an electron beam lithography apparatus and thereafter developed with a predetermined developer to form a resist pattern 50a (FIG. 5B).

Then, using the resist pattern 50a as a mask, the etching mask film 20 was dry etched to form an etching mask film pattern 20a (FIG. 5C). As a dry etching gas, a mixed gas of $Cl_2$ and $O_2$ ($Cl_2:O_2=4:1$) was used.

Then, the residual resist pattern 50a was peeled and removed by a chemical solution. Then, using the etching mask film pattern 20a as a mask, the light shieldable film 10 was dry etched using a mixed gas of $SF_6$ and He to form a light shieldable film pattern 10a (FIG. 5D).

Next, the etching mask film pattern 20a was peeled by dry etching using a mixed gas of $Cl_2$ and $O_2$ (FIG. 5E) and predetermined cleaning was carried out to obtain the photomask 100.

Comparative Example 1

Manufacture of Photomask Blank

Figure 12:
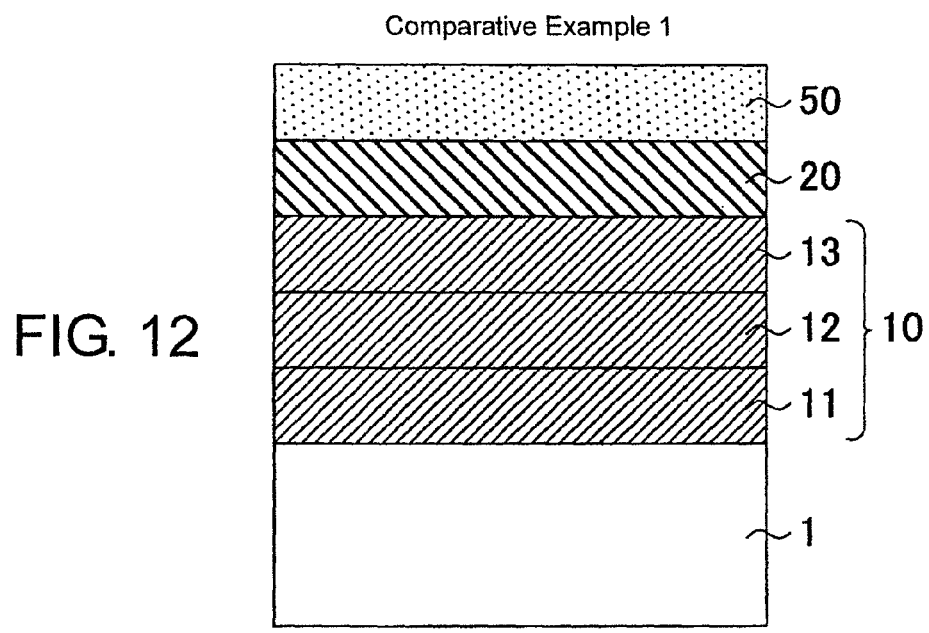
FIG. 12 is a schematic sectional view showing a photomask blank according to a comparative example 1.
Figure 13:
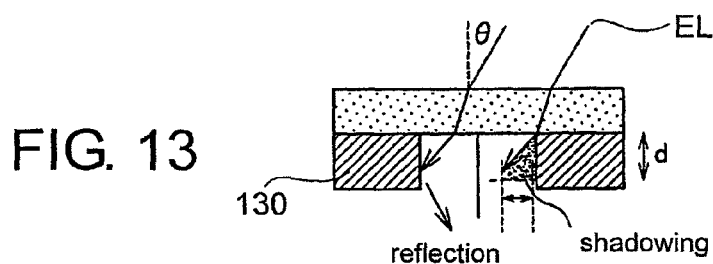
FIG. 13 is a schematic sectional view for describing a problem of shadowing.

Referring to FIG. 12, description will be made of manufacture of a photomask blank according to Comparative Example 1. In FIG. 12, a synthetic quartz substrate having a size of 6 inch square and a thickness of 0.25 inch was used as a light transmitting substrate 1. On the light transmitting substrate 1, an MoSiON film 11 (low reflection layer), an MoSi film (light shielding layer) 12, and an MoSiON film (antireflection layer) 13 were formed as a light shieldable film 10.

In detail, using a target of Mo:Si=21:79 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 21:79) was formed to a thickness of 7 nm. Then, using the target of Mo:Si=10:90 (atomic % ratio), a sputtering gas of Ar at a pressure of 0.2 Pa, and a DC power supply of 2.0 kW, a film comprising molybdenum and silicon (MoSi film:atomic % ratio of Mo and Si in the film being 10:90) was formed to a thickness of 44 nm. Then, using the same target, a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being 10:90) was formed to a thickness of 10 nm. The total thickness of the light shieldable film 10 was 61 nm. The light shieldable film 10 had an optical density (OD) of 3 at the wavelength of 193 nm of ArF excimer laser exposure light.

Next, the above-mentioned substrate was heat treated (annealed) at 400° C. for 30 minutes.

Then, on the light shieldable film 10, an etching mask film 20 was formed (FIG. 12). Specifically, using a chromium target, a sputtering gas of $N_2$ at a pressure of 0.2 Pa, and a DC power supply of 1.8 kW, a CrN film was formed as the etching mask film 20 to a thickness of 15 nm.

As described above, the photomask blank provided with the light shieldable film for ArF excimer laser exposure was obtained.

Comparative Example 1 illustrated in FIG. 12 is similar to Example 1 illustrated in FIG. 1 except that the atomic % ratio of Mo and Si in each of the MoSiON film (antireflection layer) 13 and the light shielding layer 12 is changed from about 21:79 to 10:90 and the etching mask film 20 is changed from CrOCN to CrN.

(Manufacture of Photomask)

Referring to FIGS. 5A to 5E used in describing Example 1, manufacture of a photomask according to Comparative Example 1 will be described.

On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 12, FIG. 5A).

Next, the resist film 50 was subjected to writing of a desired pattern by the use of an electron beam lithography apparatus and thereafter developed with a predetermined developer to form a resist pattern 50a (FIG. 5B).

Then, using the resist pattern 50a as a mask, the etching mask film 20 was dry etched to form an etching mask film pattern 20a (FIG. 5C). As a dry etching gas, a mixed gas of $Cl_2$ and $O_2$ ($Cl_2:O_2=4:1$) was used.

Then, the residual resist pattern 50a was peeled and removed by a chemical solution.

Then, using the etching mask film pattern 20a as a mask, the light shieldable film 10 was dry etched using a mixed gas of $SF_6$ and He to form a light shieldable film pattern 10a (FIG. 5D).

Next, the etching mask film pattern 20a was peeled by dry etching using a mixed gas of $Cl_2$ and $O_2$ (FIG. 5E) and predetermined cleaning was carried out to obtain the photomask 100.

Example 2

Manufacture of Photomask Blank

Figure 2:
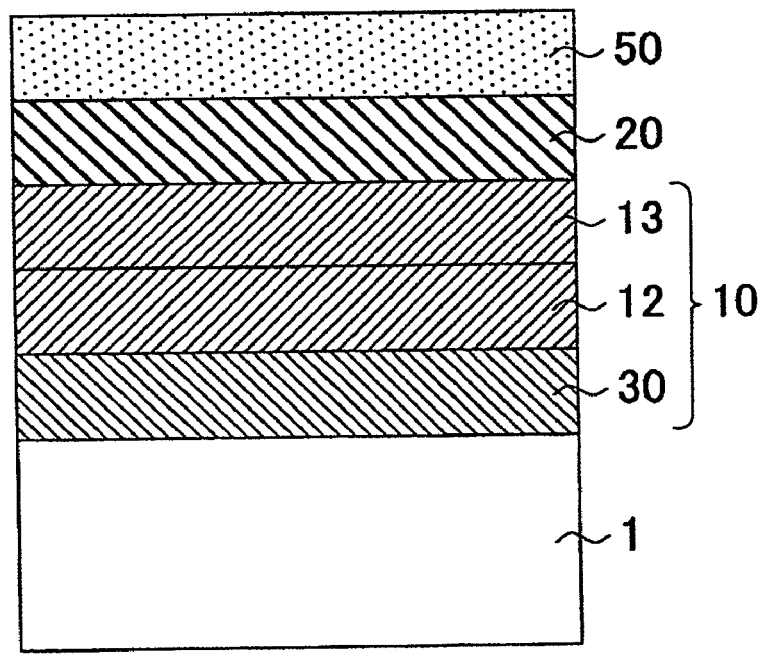
FIG. 2 is a schematic sectional view of a photomask blank according to a second example of this invention.

Referring to FIG. 2, description will be made of manufacture of a photomask blank according to Example 2 of the present invention. In FIG. 2, a synthetic quartz substrate having a size of 6 inch square and a thickness of 0.25 inch was used as a light transmitting substrate 1. On the light transmitting substrate 1, a CrN film 30 serving as a low reflection layer of a light shieldable film 10 and also as an etching mask film was formed. Specifically, using a chromium target, a sputtering gas of a mixture of Ar and $N_2$ (gas flow rate ratio Ar:$N_2$=4:1) at a pressure of 0.1 Pa, and a DC power supply of 1.3 kW, the CrN film 30 was formed to a thickness of 20 nm.

Next, on the CrN film (low reflection layer) 30, an MoSi film (light shielding layer) 12 and an MoSiON film (antireflection layer) 13 were formed as the light shieldable film 10.

In detail, using a target of Mo:Si=21:79 (atomic % ratio), a sputtering gas of Ar at a pressure of 0.1 Pa, and a DC power supply of 2.0 kW, a film comprising molybdenum and silicon (MoSi film:atomic % ratio of Mo and Si in the film being about 21:79) was formed to a thickness of 25 nm. Then, using a target of Mo:Si=4:96 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 4:96) was formed to a thickness of 10 nm. The total thickness of the light shieldable film 10 was 55 nm.

Next, the above-mentioned substrate was heat treated (annealed) at 250° C. for 5 minutes.

Then, on the light shieldable film 10, an etching mask film 20 was formed (FIG. 2). Specifically, using a chromium target, a sputtering gas of a mixture of $CO_2$ and $N_2$ at a pressure of 0.2 Pa (gas flow rate ratio $CO_2$:$N_2$=7:2), and a DC power supply of 1.8 kW, a CrOCN film was formed as the etching mask film 20 to a thickness of 18 nm. At this time, a film stress of the CrOCN film was controlled to be minimized (preferably, substantially equal to zero).

The light shieldable film 10 had an optical density (OD) of 3 at the wavelength of 193 nm of ArF excimer laser exposure light.

As described above, the photomask blank provided with the light shieldable film for ArF excimer laser exposure was obtained.

(Manufacture of Photomask)

Figure 6A:
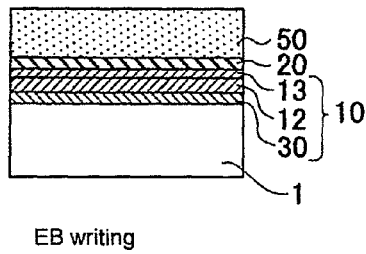
FIGS. 6A to 6K are schematic sectional views for describing a manufacturing process of a photomask according to the second example of this invention.

Referring to FIGS. 6A to 6K in addition, manufacture of a photomask according to Example 2 will be described. On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 2, FIG. 6A).

Figure 6B:
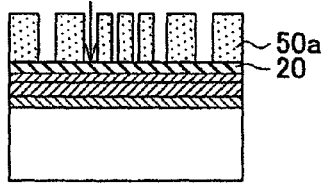

Next, the resist film 50 was subjected to writing of a desired pattern by the use of an electron beam lithography apparatus and thereafter developed with a predetermined developer to form a resist pattern 50a (FIG. 6B).

Figure 6C:
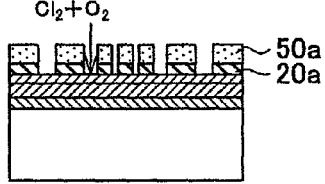

Then, using the resist pattern 50a as a mask, the etching mask film 20 was dry etched to form an etching mask film pattern 20a (FIG. 6C). As a dry etching gas, a mixed gas of $Cl_2$ and $O_2$ ($Cl_2:O_2=4:1$) was used.

Then, the residual resist pattern 50a was peeled and removed by a chemical solution.

Figure 6D:
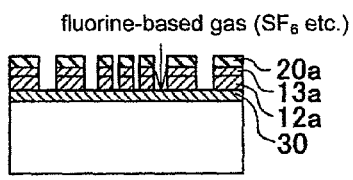

Then, using the etching mask film pattern 20a as a mask, the MoSi film (light shielding layer) 12 and the MoSiON film (antireflection layer) 13 were dry etched using a mixed gas of $SF_6$ and He to form film patterns 12a and 13a (FIG. 6D).

Figure 6E:
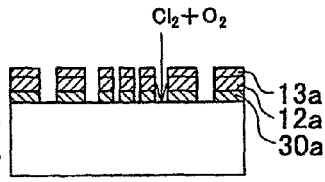

Then, using the film patterns 12a and 13a as masks, the CrN film (low reflection layer) 30 was dry etched to form a film pattern 30a. Simultaneously, the etching mask film pattern 20a of CrOCN was removed by etching (FIG. 6E). As a dry etching gas, a mixed gas of $Cl_2$ and $O_2$ ($Cl_2:O_2=4:1$) was used.

Figure 6F:
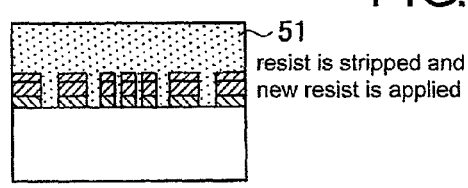

Next, a chemically amplified positive resist 51 (FEP171: manufactured by FUJIFILM Electronic Materials Co., Ltd.) for electron beam lithography (exposure) was applied again by spin coating to a thickness of 300 nm (FIG. 6F).

Figure 6G:
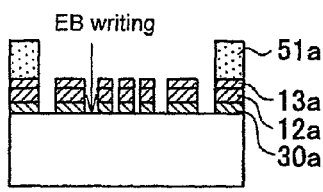

Next, the resist film 51 was subjected to writing of a desired pattern by the use of the electron beam lithography apparatus and thereafter developed with a predetermined developer to form a resist pattern 51a (FIG. 6G). Herein, the resist pattern 51a was formed for the purpose of forming a light shielding zone in an outer peripheral region of the substrate or for the purpose of forming a large-area patch pattern of a light shielding portion or a zebra pattern for controlling exposure transmittance.

Figure 6H:
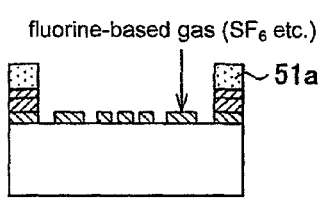

Next, using the resist pattern 51a as a mask, the film patterns 12a and 13a were peeled by dry etching (FIG. 6H). As a dry etching gas, use was made of a mixed gas of $SF_6$ and He, which provides a relatively high selectivity between the light transmitting substrate 1 and the film patterns 12a and 13a comprising molybdenum silicide as a main component.

Figure 6I:
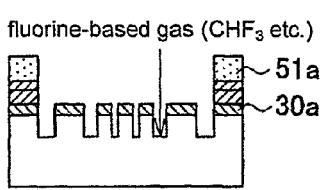

Next, using the resist pattern 51a and the film pattern 30a as masks, the light transmitting substrate 1 was dry etched using a mixed gas of $CHF_3$ and He to form a phase shift pattern of a substrate dug-down type (FIG. 6I). At this time, the substrate was dug down to the depth (about 170 nm) adapted to provide a phase difference of 180°.

Figure 6J:
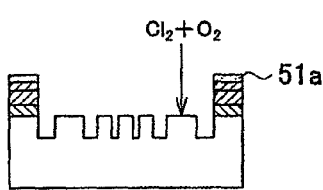
Figure 6K:
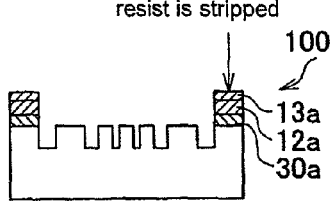

Then, using the resist pattern 51a as a mask, the film pattern 30a was peeled by dry etching (FIG. 6J). As a dry etching gas, a mixed gas of $Cl_2$ and $O_2$ ($Cl_2:O_2=4:1$) was used.

Next, the residual thin resist pattern 51a was peeled (FIG. 6K) and predetermined cleaning was carried out to obtain the photomask 100.

In the above-mentioned example of manufacturing the photomask, the etching mask film pattern 20a was entirely removed. However, it is sometimes desired that the etching mask film pattern 20a, alone or in combination with the antireflection layer 13 of the light shieldable film 10, has an antireflection function for the exposure light and, for this purpose, a corresponding part of the etching mask film pattern 20a is left in the photomask. In this event, after the etching mask film pattern 20a is formed (between the process of FIG. 6C and the process of FIG. 6D), the film pattern 30a may be formed without peeling the resist pattern 50a. In this case, it is necessary to add, after the resist pattern 51a is formed (between the process of FIG. 6G and the process of FIG. 6H), a process of removing the etching mask film pattern 20a, except in an area protected by the resist pattern 51a, by dry etching using a mixed gas of chlorine and oxygen.

Reference Example 2

Manufacture of Photomask Blank

Figure 11:
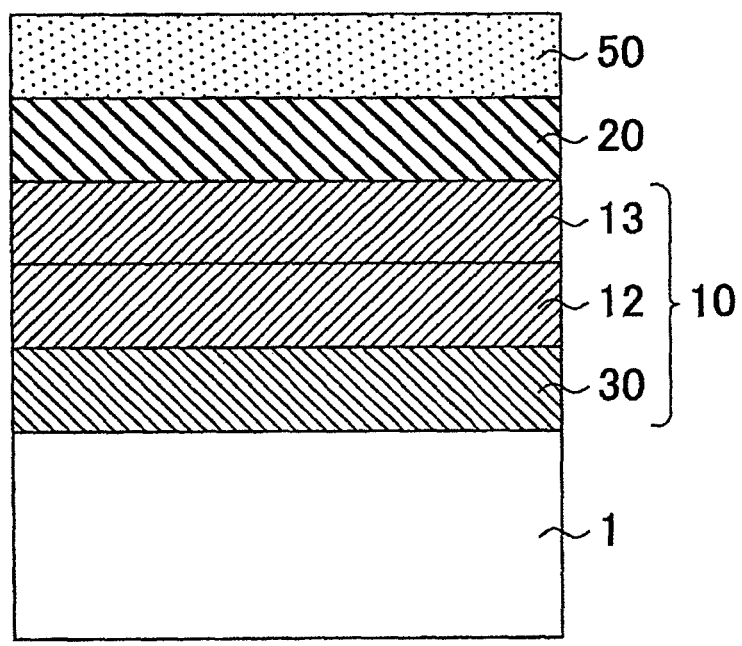
FIG. 11 is a schematic sectional view showing a photomask blank according to a reference example 2.

Referring to FIG. 11, description will be made of manufacture of a photomask blank according to Reference Example 2. In FIG. 11, a synthetic quartz substrate having a size of 6 inch square and a thickness of 0.25 inch was used as a light transmitting substrate 1. On the light transmitting substrate 1, a CrN film 30 serving as a low reflection layer of a light shieldable film 10 and also as an etching mask was formed. Specifically, using a chromium target, a sputtering gas of a mixture of Ar and $N_2$ (gas flow rate ratio $Ar:N_2=4:1$) at a pressure of 0.1 Pa, and a DC power supply of 1.3 kW, the CrN film 30 was formed to a thickness of 20 nm. Next, on the CrN film (low reflection layer) 30, an MoSi film (light shielding layer) 12 and an MoSiON film (antireflection layer) 13 were formed as the light shieldable film 10.

In detail, using a target of Mo:Si=21:79 (atomic % ratio), a sputtering gas of Ar at a pressure of 0.1 Pa, and a DC power supply of 2.0 kW, a film comprising molybdenum and silicon (MoSi film:atomic % ratio of Mo and Si in the film being about 21:79) was formed to a thickness of 25 nm. Then, using the same target, a sputtering gas of a mixture of Ar, $O_2$, $N_2$, and He at a pressure of 0.2 Pa (gas flow rate ratio $Ar:O_2:N_2:He=5:4:49:42$), and a DC power supply of 3.0 kW, a film comprising molybdenum, silicon, oxygen, and nitrogen (MoSiON film:atomic % ratio of Mo and Si in the film being about 21:79) was formed to a thickness of 10 nm. The total thickness of the light shieldable film 10 was 55 nm.

Next, the above-mentioned substrate was heat treated (annealed) at 250° C. for 5 minutes.

Then, on the light shieldable film 10, an etching mask film 20 was formed (FIG. 11). Specifically, using a chromium target, a sputtering gas of $N_2$ at a pressure of 0.2 Pa, and a DC power supply of 1.8 kW, a CrN film was formed as the etching mask film 20 to a thickness of 18 nm.

The light shieldable film 10 had an optical density (OD) of 3 at the wavelength of 193 nm of ArF excimer laser exposure light.

As described above, the photomask blank provided with the light shieldable film for ArF excimer laser exposure was obtained.

Reference Example 2 illustrated in FIG. 11 is similar to Example 2 illustrated in FIG. 2 except that the atomic % ratio of Mo and Si in the MoSiON film (antireflection layer) 13 is changed from about 4:96 to about 21:79 and the etching mask film 20 is changed from CrOCN to CrN.

(Manufacture of Photomask)

Referring to FIGS. 6A to 6K used in describing Example 2, manufacture of a photomask according to Reference Example 2 will be described.

On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 11, FIG. 6A).

Next, the resist film 50 was subjected to writing of a desired pattern by the use of an electron beam lithography apparatus and thereafter developed with a predetermined developer to form a resist pattern 50a (FIG. 6B).

Then, using the resist pattern 50a as a mask, the etching mask film 20 was dry etched to form an etching mask film pattern 20a (FIG. 6C). As a dry etching gas, a mixed gas of $Cl_2$ and $O_2$ ($Cl_2$:$O_2$=4:1) was used.

Then, the residual resist pattern 50a was peeled and removed by a chemical solution.

Then, using the etching mask film pattern 20a as a mask, the MoSi film (light shielding layer) 12 and the MoSiON film (antireflection layer) 13 were dry etched using a mixed gas of $SF_6$ and He to form film patterns 12a and 13a (FIG. 6D).

Then, using the film patterns 12a and 13a as masks, the CrN film (low reflection layer) 30 was dry etched to form a film pattern 30a. Simultaneously, the etching mask film pattern 20a of CrN was removed by etching (FIG. 6E). As a dry etching gas, a mixed gas of $Cl_2$ and $O_2$ ($Cl_2$:$O_2$=4:1) was used.

Next, a chemically amplified positive resist 51 (FEP171: manufactured by FUJIFILM Electronic Materials Co., Ltd.) for electron beam lithography (exposure) was applied again by spin coating to a thickness of 300 nm (FIG. 6F).

Next, the resist film 51 was subjected to writing of a desired pattern by the use of the electron beam lithography apparatus and thereafter developed with a predetermined developer to form a resist pattern 51a (FIG. 6G). Herein, the resist pattern 51a was formed for the purpose of forming a light shielding zone in an outer peripheral region of the substrate or for the purpose of forming a large-area patch pattern of a light shielding portion or a zebra pattern for controlling transmittance.

Next, using the resist pattern 51a as a mask, the film patterns 12a and 13a were peeled by dry etching (FIG. 6H). As a dry etching gas, use was made of a mixed gas of $SF_6$ and He, which provides a relatively high selectivity between the light transmitting substrate 1 and the film patterns 12a and 13a comprising molybdenum silicide as a main component.

Next, using the resist pattern 51a and the film pattern 30a as masks, the light transmitting substrate 1 was dry etched using a mixed gas of $CHF_3$ and He to form a phase shift pattern of a substrate dug-down type (FIG. 6I). At this time, the substrate was dug down to the depth (about 170 nm) adapted to provide a phase difference of 180°.

Then, using the resist pattern 51a as a mask, the film pattern 30a was peeled by dry etching (FIG. 6J). As a dry etching gas, a mixed gas of $Cl_2$ and $O_2$ ($Cl_2$:$O_2$=4:1) was used.

Next, the residual thin resist pattern 51a was peeled (FIG. 6K) and predetermined cleaning was carried out to obtain the photomask 100.

Example 3

Manufacture of Photomask Blank

Figure 3:
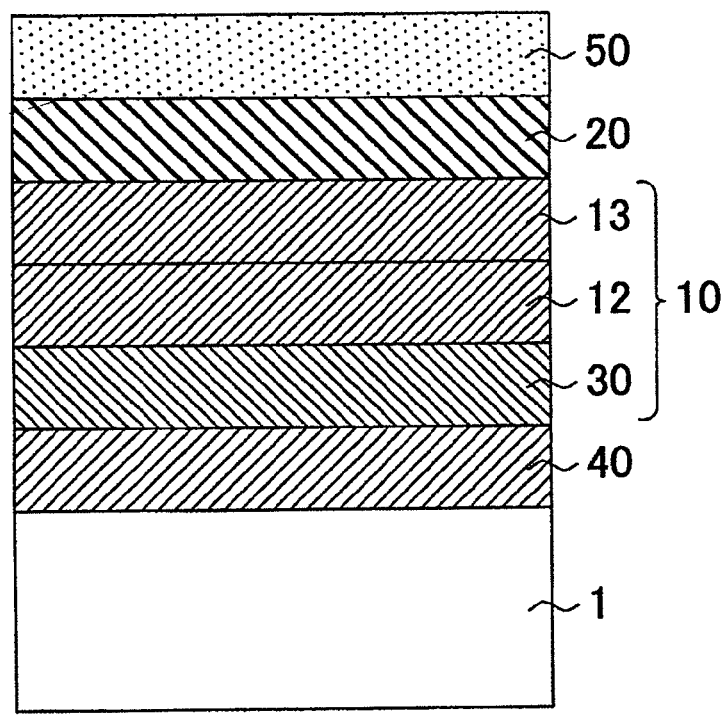
FIG. 3 is a schematic sectional view of a photomask blank according to a third example of this invention.

Referring to FIG. 3, description will be made of manufacture of a photomask blank according to Example 3 of the present invention. In FIG. 3, a synthetic quartz substrate having a size of 6 inch square and a thickness of 0.25 inch was used as a light transmitting substrate 1. On the light transmitting substrate 1, an MoSiN-based halftone phase shift film 40 was formed. Specifically, using a target of Mo:Si=10:90 (atomic % ratio), a sputtering gas of a mixture of argon (Ar) and nitrogen ($N_2$) at a pressure of 0.2 Pa (gas flow rate ratio Ar:$N_2$=10:90), and a DC power supply of 3.0 kW, the MoSiN-based light semi-transmitting halftone phase shift film 40 having a thickness of 69 nm was formed. Herein, the thickness of the halftone phase shift film 40 was adjusted so that a phase difference of 180° was obtained for the exposure wavelength of 193 nm. The halftone phase shift film 40 had a transmittance of 6% for the exposure wavelength of 193 nm.

Next, a CrN film (low reflection layer) 30 was formed on the halftone phase shift film 40 (FIG. 3). Specifically, using a chromium target, a sputtering gas of a mixture of Ar and $N_2$ at a pressure of 0.1 Pa (gas flow rate ratio Ar:$N_2$=4:1), and a DC power supply of 1.3 kW, the CrN film 30 was formed to a thickness of 15 nm.

Next, on the CrN film 30, an MoSi film (light shielding layer) 12 and an MoSiON film (antireflection layer) 13 were formed as the light shieldable film 10 (FIG. 3).

In detail, using a target of Mo:Si=21:79 (atomic % ratio), a sputtering gas of Ar at a pressure of 0.1 Pa, and a DC power supply of 2.0 kW, a film comprising molybdenum and silicon (MoSi film:atomic % ratio of Mo and Si in the film being about 21:79) was formed to a thickness of 11 nm. Then, using a target of Mo:Si=4:96 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 4:96) was formed to a thickness of 10 nm. The total thickness of the light shieldable film 10 was 36 nm.

Next, the above-mentioned substrate was heat treated (annealed) at 250° C. for 5 minutes.

Then, on the light shieldable film 10, an etching mask film 20 was formed (FIG. 3). Specifically, using a chromium target, a sputtering gas of a mixture of $CO_2$ and $N_2$ (gas flow rate ratio $CO_2$:$N_2$=7:2), and a DC power supply of 1.8 kW, a CrOCN film was formed as the etching mask film 20 to a thickness of 15 nm. At this time, a film stress of the CrOCN film was controlled to be minimized (preferably, substantially equal to zero).

A laminated film comprising the halftone phase shift film 40 and the light shieldable film 10 had an optical density (OD) of 3 at the wavelength of 193 nm of ArF excimer laser exposure light.

As described above, the photomask blank provided with the light shieldable film for ArF excimer laser exposure was obtained.

(Manufacture of Photomask)

Referring to FIGS. 7A to 7J, manufacture of a photomask according to Example 3 will be described. On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 3, FIG. 7A).

Next, the resist film 50 was subjected to writing of a desired pattern by the use of an electron beam lithography apparatus and thereafter developed with a predetermined developer to form a resist pattern 50a (FIG. 7B).

Then, using the resist pattern 50a as a mask, the etching mask film 20 was dry etched to form an etching mask film pattern 20a (FIG. 7C). As a dry etching gas, a mixed gas of $Cl_2$ and $O_2$ ($Cl_2$:$O_2$=4:1) was used.

Then, the residual resist pattern 50a was peeled and removed by a chemical solution.

Then, using the etching mask film pattern 20a as a mask, the MoSi film (light shielding layer) 12 and the MoSiON film (antireflection layer) 13 were dry etched using a mixed gas of $SF_6$ and He to form film patterns 12a and 13a (FIG. 7D).

Then, using the film patterns 12a and 13a as masks, the CrN film (low reflection layer) 30 was dry etched to form a film pattern 30a. Simultaneously, the etching mask film pattern 20a of CrOCN was removed by etching (FIG. 7E). As a dry etching gas, a mixed gas of $Cl_2$ and $O_2$ ($Cl_2:O_2=4:1$) was used.

Next, a chemically amplified positive resist 51 (FEP171: manufactured by FUJIFILM Electronic Materials Co., Ltd.) for electron beam lithography (exposure) was applied again by spin coating to a thickness of 300 nm (FIG. 7F).

Next, the resist film 51 was subjected to writing of a desired pattern by the use of the electron beam lithography apparatus and thereafter developed with a predetermined developer to form a resist pattern 51a (FIG. 7G). Herein, the resist pattern 51a was formed for the purpose of forming a light shielding zone in an outer peripheral region of the substrate.

Next, using the film pattern 30a as a mask, the halftone phase shift film 40 was dry etched using a mixed gas of $SF_6$ and He to form a halftone phase shift film pattern 40a. Simultaneously, the film patterns 12a and 13a of MoSi and MoSiON were removed by etching (FIG. 7H).

Then, using the resist pattern 51a as a mask, the film pattern 30a was peeled by dry etching (FIG. 7I). As a dry etching gas, a mixed gas of $Cl_2$ and $O_2$ ($Cl_2:O_2=4:1$) was used.

Next, the residual thin resist pattern 51a was peeled (FIG. 7J) and predetermined cleaning was carried out to obtain the photomask 100.

In the above-mentioned example of manufacturing the photomask, the etching mask film pattern 20a was entirely removed. However, it is sometimes desired that the etching mask film pattern 20a, alone or in combination with the antireflection layer 13 of the light shieldable film 10, has an antireflection function for the exposure light and, for this purpose, a corresponding part of the etching mask film pattern 20a is left in the photomask. In this event, after the etching mask film pattern 20a is formed (between the process of FIG. 7C and the process of FIG. 7D), the film pattern 30a may be formed without peeling the resist pattern 50a. In this case, it is necessary to add, after the resist pattern 51a is formed (between the process of FIG. 7G and the process of FIG. 7H), a process of removing the etching mask film pattern 20a, except in an area protected by the resist pattern 51a, by dry etching using a mixed gas of chlorine and oxygen.

Example 4

Manufacture of Photomask Blank

Figure 4:
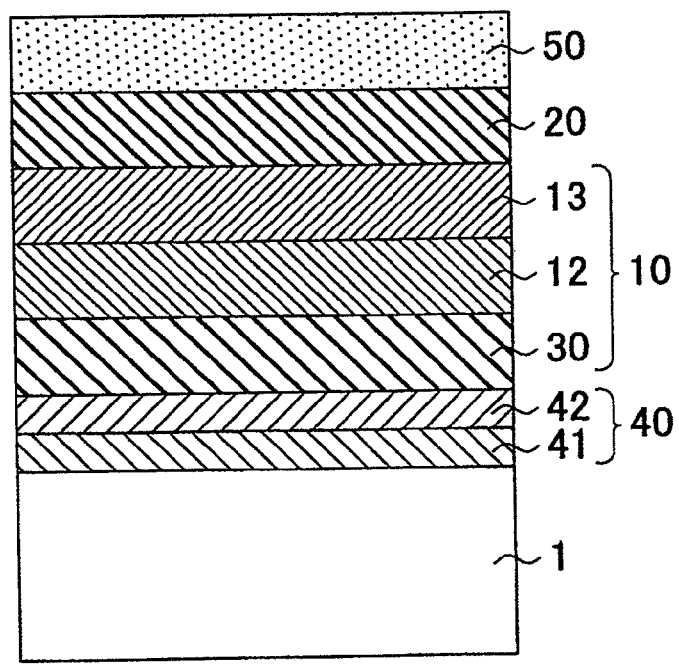
FIG. 4 is a schematic sectional view of a photomask blank according to a fourth example of this invention.

Referring to FIG. 4, description will be made of manufacture of a photomask blank according to Example 4 of the present invention. In FIG. 4, a synthetic quartz substrate having a size of 6 inch square and a thickness of 0.25 inch was used as a light transmitting substrate 1. On the light transmitting substrate 1, a high-transmittance halftone phase shift film 40 comprising a laminated film of a transmittance adjusting layer 41 of TaHf and a phase adjusting layer 42 of SiON was formed. Specifically, using a target of Ta:Hf=80:20 (atomic % ratio) and a sputtering gas of Ar, the TaHf film (transmittance adjusting layer:atomic % ratio of Ta and Hf in the film being about 80:20) 41 was formed to a thickness of 12 nm. Next, using an Si target, a sputtering gas of a mixture of argon (Ar) and nitric oxide (NO) (gas flow rate ratio Ar:NO=20:80), and a DC power supply of 2.0 kW, the SiON film (phase adjusting layer) 42 was formed to a thickness of 112 nm. Herein, the thickness of each layer of the halftone phase shift film 40 was adjusted so that a phase difference of 180° was obtained for the wavelength of 193 nm of ArF excimer laser exposure light. The halftone phase shift film 40 had a high transmittance of 20% for the exposure wavelength of 193 nm.

Next, a CrN film (low reflection layer) 30 was formed on the SiON film 42 (FIG. 4). Specifically, using a chromium target, a sputtering gas of a mixture of Ar and $N_2$ (gas flow rate ratio Ar:$N_2$=4:1) at a pressure of 0.1 Pa, and a DC power supply of 1.3 kW, the CrN film 30 was formed to a thickness of 20 nm.

Next, on the CrN film (low reflection layer) 30, an MoSi film (light shielding layer) 12, and an MoSiON film (antireflection layer) 13 were formed as the light shieldable film 10 (FIG. 4).

In detail, using a target of Mo:Si=21:79 (atomic % ratio), a sputtering gas of Ar at a pressure of 0.1 Pa, and a DC power supply of 2.0 kW, a film comprising molybdenum and silicon (MoSi film:atomic % ratio of Mo and Si in the film being about 21:79) was formed to a thickness of 14 nm. Then, using a target of Mo:Si=4:96 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 3.0 kW, a film comprising molybdenum, silicon, oxygen, and nitrogen (MoSiON film:atomic % ratio of Mo and Si in the film being about 4:96) was formed to a thickness of 10 nm. The total thickness of the light shieldable film 10 was 44 nm.

Next, the above-mentioned substrate was heat treated (annealed) at 250° C. for 5 minutes.

Then, on the light shieldable film 10, an etching mask film 20 was formed (FIG. 4). Specifically, using a chromium target, a sputtering gas of a mixture of $CO_2$ and $N_2$ at a pressure of 0.2 Pa (gas flow rate ratio $CO_2$:$N_2$=7:2), and a DC power supply of 1.8 kW, a CrOCN film was formed as the etching mask film 20 to a thickness of 18 nm. At this time, a film stress of the CrOCN film was controlled to be minimized (preferably, substantially equal to zero).

A laminated film comprising the halftone phase shift film 40 and the light shieldable film 10 had an optical density (OD) of 3.0 at the wavelength of 193 nm of ArF excimer laser exposure light.

As described above, the photomask blank provided with the light shieldable film for ArF excimer laser exposure was obtained.

(Manufacture of Photomask)

Referring to FIGS. 8A to 8M, manufacture of a photomask according to Example 4 will be described. On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 4, FIG. 8A).

Next, the resist film 50 was subjected to writing of a desired pattern by the use of an electron beam lithography apparatus and thereafter developed with a predetermined developer to form a resist pattern 50a (FIG. 8B).

Then, using the resist pattern 50a as a mask, the etching mask film 20 was dry etched to form an etching mask film pattern 20a (FIG. 8C). As a dry etching gas, a mixed gas of $Cl_2$ and $O_2$ ($Cl_2:O_2=4:1$) was used.

Then, the residual resist pattern 50a was peeled and removed by a chemical solution.

Then, using the etching mask film pattern 20a as a mask, the MoSi film (light shielding layer) 12 and the MoSiON film (antireflection layer) 13 were dry etched using a mixed gas of $SF_6$ and He to form film patterns 12a and 13a (FIG. 8D).

Then, using the film patterns 12a and 13a as masks, the CrN film (low reflection layer) 30 was dry etched to form a film pattern 30a. Simultaneously, the etching mask film pattern 20a of CrOCN was removed by etching (FIG. 8E). As a dry etching gas, a mixed gas of $Cl_2$ and $O_2$ ($Cl_2:O_2=4:1$) was used.

Next, a chemically amplified positive resist 51 (FEP171: manufactured by FUJIFILM Electronic Materials Co., Ltd.) for electron beam lithography (exposure) was applied again by spin coating to a thickness of 300 nm (FIG. 8F).

Next, the resist film 51 was subjected to writing of a desired pattern by the use of the electron beam lithography apparatus and thereafter developed with a predetermined developer to form a resist pattern 51a (FIG. 8G). Herein, the resist pattern 51a was formed for the purpose of forming a light shielding zone in an outer peripheral region of the substrate.

Then, using the resist pattern 51a as a mask, the film patterns 12a and 13a were removed by dry etching (FIG. 8H). As a dry etching gas, a mixed gas of $SF_6$ and He was used.

Next, using the film pattern 30a as a mask, the SiON film (phase adjusting layer) 42 was dry etched using a fluorine-based gas (mixed gas of $CHF_3$ and He) to form a film pattern 42a (FIG. 8I).

Then, using the film patterns 30a and 42a as masks, the TaHf film (transmittance adjusting layer) 41 was dry etched using a chlorine-based gas ($Cl_2$ gas) substantially free from oxygen to form a film pattern 41a (FIG. 8J).

Then, using the resist pattern 51a as a mask, the film pattern 30a was peeled by dry etching (FIG. 8K). As a dry etching gas, a mixed gas of $Cl_2$ and $O_2$ ($Cl_2:O_2$=4:1) was used.

Next, the residual thin resist pattern 51a was peeled (FIG. 8L) and predetermined cleaning was carried out to obtain the photomask 100 (FIG. 8M).

In the above-mentioned example of manufacturing the photomask, the etching mask film pattern 20a was entirely removed. However, it is sometimes desired that the etching mask film pattern 20a, alone or in combination with the antireflection layer 13 of the light shieldable film 10, has an antireflection function for the exposure light and, for this purpose, a corresponding part of the etching mask film pattern 20a is left in the photomask. In this event, after the etching mask film pattern 20a is formed (between the process of FIG. 8C and the process of FIG. 8D), the film pattern 30a may be formed without peeling the resist pattern 50a. In this case, it is necessary to add, after the resist pattern 51a is formed (between the process of FIG. 8G and the process of FIG. 8H), a process of removing the etching mask film pattern 20a, except in an area protected by the resist pattern 51a, by dry etching using a mixed gas of chlorine and oxygen.

In the above-mentioned example of manufacturing the photomask, the film patterns 12a and 13a of MoSi and MoSiON were dry etched using a mixed gas of $SF_6$ and He (FIG. 8H) and the SiON film (phase adjusting layer) 42 was dry etched using a mixed gas of $CHF_3$ and He to form the film pattern 42a (FIG. 8I). Alternatively, the SiON film (phase adjusting layer) 42 and the film patterns 12a and 13a of MoSi and MoSiOn may be simultaneously dry etched using a mixed gas of $CHF_3$ and He.

Example 5

Manufacture of Photomask Blank

Referring to FIG. 3 used in describing Example 3, description will be made of manufacture of a photomask blank according to Example 5 of the present invention.

A synthetic quartz substrate having a size of 6 inch square and a thickness of 0.25 inch was used as a light transmitting substrate 1. On the light transmitting substrate 1, a MoSiN-based halftone phase shift film 40 was formed. Specifically, using a target of Mo:Si=10:90 (atomic % ratio), a sputtering gas of a mixture of argon (Ar), nitrogen ($N_2$), and helium (He) at a pressure of 0.2 Pa (gas flow rate ratio Ar:$N_2$:He=5:50:45), and a DC power supply of 3.0 kW, the MoSiN-based light semi-transmitting halftone phase shift film 40 having a thickness of 40 nm was formed (FIG. 3). Herein, the transmittance of the halftone phase shift film 40 was adjusted to be equal to 20%.

Next, a CrN film (low reflection layer) 30 was formed (FIG. 3). Specifically, using a chromium target, a sputtering gas of a mixture of Ar and $N_2$ at a pressure of 0.1 Pa (gas flow rate ratio Ar:$N_2$=4:1), and a DC power supply of 1.3 kW, the CrN film 30 was formed to a thickness of 20 nm.

Next, on the CrN film (low reflection layer) 30, an MoSi film (light shielding layer) 12 and an MoSiON film (antireflection layer) 13 were formed as the light shieldable film 10 (FIG. 3).

In detail, using a target of Mo:Si=21:79 (atomic % ratio), a sputtering gas of Ar at a pressure of 0.1 Pa, and a DC power supply of 2.0 kW, a film comprising molybdenum and silicon (MoSi film:atomic % ratio of Mo and Si in the film being about 21:79) was formed to a thickness of 14 nm. Then, using a target of Mo:Si=4:96 (atomic % ratio), a sputtering gas of a mixture of Ar, $O_2$, $N_2$, and He at a pressure of 0.2 Pa (gas flow rate ratio Ar:$O_2$:$N_2$:He=5:4:49:42), and a DC power supply of 2.0 kW, a film comprising molybdenum, silicon, oxygen, and nitrogen (MoSiON film:atomic % ratio of Mo and Si in the film being about 4:96) was formed to a thickness of 10 nm. The total thickness of the light shieldable film 10 was 44 nm.

Next, the above-mentioned substrate was heat treated (annealed) at 250° C. for 5 minutes.

Then, on the light shieldable film 10, an etching mask film 20 was formed (FIG. 3). Specifically, using a chromium target, a sputtering gas of a mixture of $CO_2$ and $N_2$ at a pressure of 0.2 Pa (gas flow rate ratio $CO_2$:$N_2$=7:2), and a DC power supply of 1.8 kW, a CrOCN film was formed as the etching mask film 20 to a thickness of 15 nm. At this time, a film stress of the CrOCN film was controlled to be minimized (preferably, substantially equal to zero).

A laminated film comprising the halftone phase shift film 40, the light shieldable film 10, and the etching mask film 20 had an optical density (OD) of 3 at the wavelength of 193 nm of ArF excimer laser exposure light.

As described above, the photomask blank provided with the light shieldable film for ArF excimer laser exposure was obtained.

(Manufacture of Photomask)

Figure 9A:
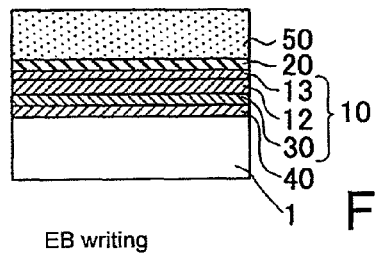
FIGS. 9A to 9J are schematic sectional views for describing a manufacturing process of a photomask according to a fifth example of this invention.

Referring to FIGS. 9A to 9J, manufacture of a photomask according to Example 5 will be described. On the etching mask film 20 of the photomask blank, a chemically amplified positive resist 50 (PRL009: manufactured by FUJIFILM Electronic Materials Co., Ltd.) for electron beam lithography (exposure) was applied by spin coating to a thickness of 150 nm (FIG. 3, FIG. 9A).

Figure 9B:
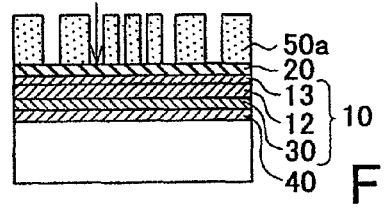

Next, the resist film 50 was subjected to writing of a desired pattern by the use of an electron beam lithography apparatus and thereafter developed with a predetermined developer to form a resist pattern 50a (FIG. 9B).

Figure 9C:
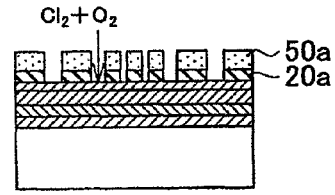

Then, using the resist pattern 50a as a mask, the etching mask film 20 was dry etched to form an etching mask film pattern 20a (FIG. 9C). As a dry etching gas, a mixed gas of $Cl_2$ and $O_2$ ($Cl_2$:$O_2$=4:1) was used.

Then, the residual resist pattern 50a was peeled and removed by a chemical solution.

Figure 9D:
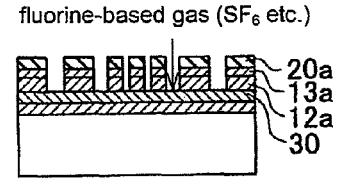

Then, using the etching mask film pattern 20a as a mask, the MoSi film (light shielding layer) 12 and the MoSiON film (antireflection layer) 13 were dry etched using a mixed gas of $SF_6$ and He to form film patterns 12a and 13a (FIG. 9D).

Figure 9E:
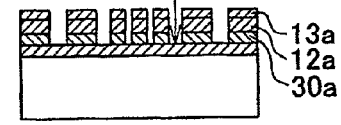

Then, using the film patterns 12a and 13a as masks, the CrN film (low reflection layer) 30 was dry etched to form a film pattern 30a. Simultaneously, the etching mask film pattern 20a of CrOCN was removed by etching (FIG. 9E). As a dry etching gas, a mixed gas of $Cl_2$ and $O_2$ ($Cl_2:O_2$=4:1) was used.

Figure 9F:
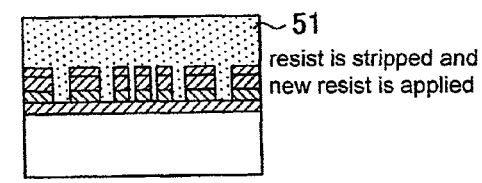

Next, a chemically amplified positive resist 51 (FEP171: manufactured by FUJIFILM Electronic Materials Co., Ltd.) for electron beam lithography (exposure) was applied again by spin coating to a thickness of 300 nm (FIG. 9F).

Figure 9G:
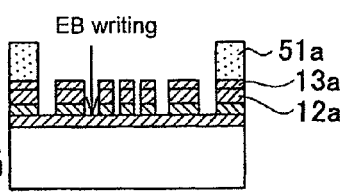

Next, the resist film 51 was subjected to writing of a desired pattern by the use of the electron beam lithography apparatus and thereafter developed with a predetermined developer to form a resist pattern 51a (FIG. 9G). Herein, the resist pattern 51a was formed for the purpose of forming a large-area patch pattern of a light shielding portion, a transmittance adjusting pattern, and a light shielding zone in an outer peripheral region of the substrate.

Figure 9H:
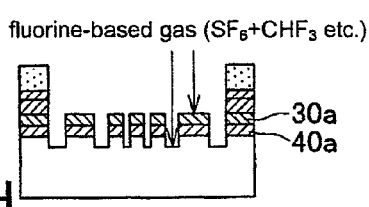

Next, using the resist pattern 51a as a mask, the film patterns 12a and 13a were peeled by dry etching (FIG. 9H). As a dry etching gas, a mixed gas of $SF_6$ and He was used.

Figure 9I:
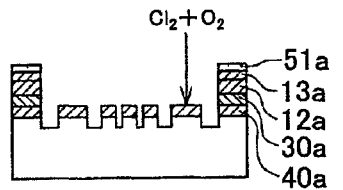

Next, using the film pattern 30a as a mask, the halftone phase shift film 40 and the light transmitting substrate 1 were successively dry etched using a mixed gas of $CHF_3$ and He to form a halftone phase shift film pattern 40a and a phase shift pattern of a substrate dug-down type (FIG. 9I). At this time, the substrate was dug down to the depth such that a phase difference of 180° is obtained as a result of combination of the halftone phase shift film pattern 40a and the phase shift pattern of a substrate dug-down type (the light transmitting substrate 1 was dug down to the depth of about 70 nm). Simultaneously, the film patterns 12a and 13a of MoSi and MoSiON were removed by etching.

Then, using the resist pattern 51a as a mask, the film pattern 30a was peeled by dry etching (FIG. 9I). As a dry etching gas, a mixed gas of $Cl_2$ and $O_2$ ($Cl_2:O_2$=4:1) was used.

Figure 9J:
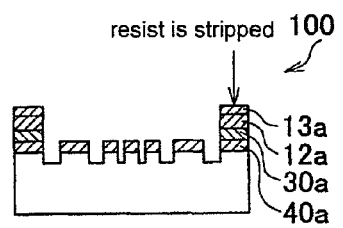

Next, the residual thin resist pattern 51a was peeled and predetermined cleaning was carried out to obtain the photomask 100 (FIG. 9J).

In the above-mentioned example of manufacturing the photomask, the etching mask film pattern 20a was entirely removed. However, it is sometimes desired that the etching mask film pattern 20a, alone or in combination with the antireflection layer 13 of the light shieldable film 10, has an antireflection function for the exposure light and, for this purpose, a corresponding part of the etching mask film pattern 20a is left in the photomask. In this event, after the etching mask film pattern 20a is formed (between the process of FIG. 9C and the process of FIG. 9D), the film pattern 30a may be formed without peeling the resist pattern 50a. In this case, it is necessary to add, after the resist pattern 51a is formed (between the process of FIG. 9G and the process of FIG. 9H), a process of removing the etching mask film pattern 20a, except in an area protected by the resist pattern 51a, by dry etching using a mixed gas of chlorine and oxygen.

In the above-mentioned example of manufacturing the photomask, using a mixed gas of $SF_6$ and He, formation of the halftone phase shift film pattern 40a and the phase shift pattern of a substrate dug-down type and removal of the film patterns 12a and 13a of MoSi and MoSiON were successively carried out. However, formation of the halftone phase shift film pattern 40a and removal of the film patterns 12a and 13a may be simultaneously or sequentially performed by dry etching using a mixed gas of $SF_6$ and He.

(Evaluation)

Each of the photomasks obtained as mentioned above was evaluated. The result is described below.

(Reduction in Thickness)

At first, comparison will be made of the photomask blanks of Example 1, Reference Example 1, and Comparative Example 1 as photomask blanks of the type used in manufacturing a binary photomask which does not use the phase shift effect.

In the photomask blank in Comparative Example 1, the light shieldable film 10 must have a thickness of 60 nm or more in order to achieve the OD value of 3 or more. The light shielding layer 12 must have a thickness of 44 nm or more.

On the other hand, in the photomask blanks in Example 1 and Reference Example 1, the thickness of the light shieldable film 10 can be equal to or smaller than 55 nm (specifically, could be equal to 52 nm). The thickness of the light shielding layer 12 can be smaller than 40 nm (specifically, could be equal to 35 nm).

(Improvement in Heat Treatment Resistance)

After the light shieldable film 10 was formed, heat treatment was carried out. Comparison was made about the resistance of the light shieldable film 10 against the heat treatment. Specifically, comparison was made between the photomask blanks in Example 1 and Reference Example 1 and between the photomask blanks in Example 2 and Reference Example 2. In each pair, the light shieldable films 10 were formed under the same conditions except that the molybdenum content of the antireflection layer 13 was different.

Figure 15:
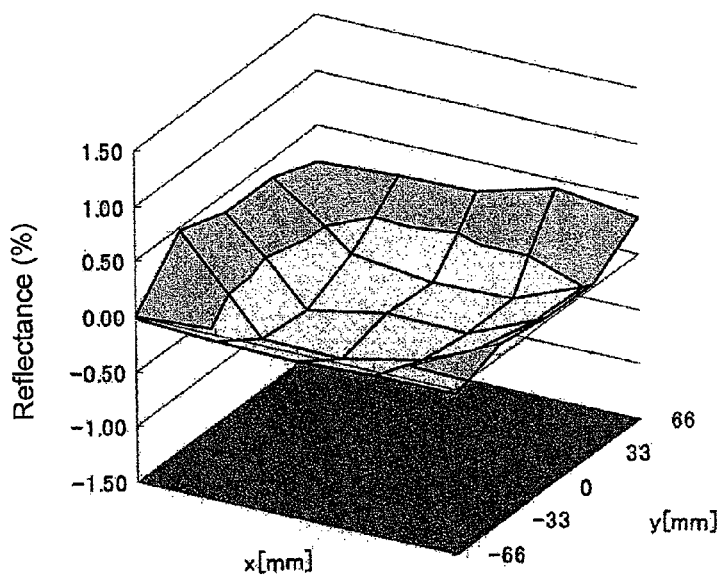
FIG. 15 is a view related to surface reflectance distribution of a light shieldable film after heat treatment of the photomask according to the first example of this invention.

FIG. 15 shows a surface reflectance distribution of the light shieldable film after the photomask in Example 1 was heat treated (the light shieldable film of Example 2 has the same structure as that of the light shieldable film of Example 1 and therefore has a surface reflectance distribution same as that in FIG. 15).

Figure 16:
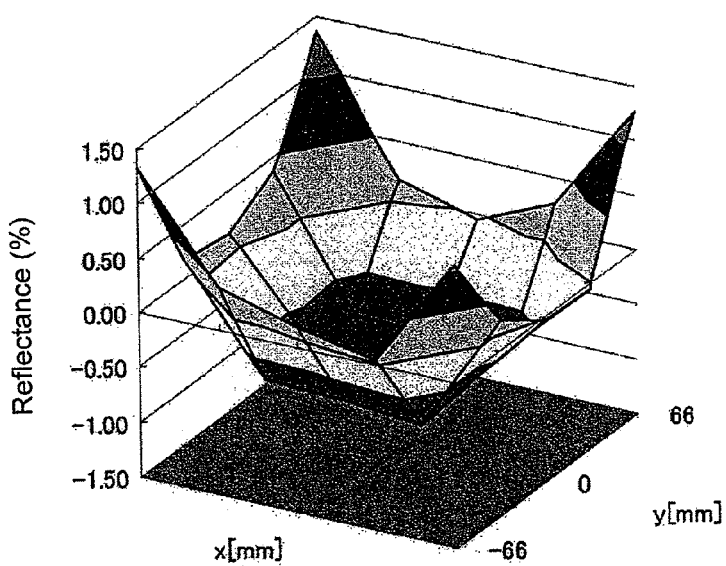
FIG. 16 is a view related to surface reflectance distribution of a light shieldable film after heat treatment of a photomask according to the reference example 1.

On the other hand, FIG. 16 shows a surface reflectance distribution of the light shieldable film after the photomask in Reference Example 1 was heat treated (the light shieldable film of Reference Example 2 has the same structure as that of the light shieldable film in Reference Example 1 and therefore has a surface reflectance distribution same as that in FIG. 16).

The light shieldable films 10 of the photomask blanks in Reference Examples 1 and 2 were clouded because MoO was deposited on the surface due to the heat treatment.

Furthermore, as shown in FIG. 16, the surface reflectance distribution is degraded as a result of deposition of MoO (a difference between a highest level and a lowest level of the surface reflectance being equal to 2.2%).

On the other hand, the light shieldable films 10 of the photomask blanks in Examples 1 and 2 were not clouded due to the heat treatment and the surface reflectance distribution was not degraded (a difference between a highest level and a lowest level of the surface reflectance being equal to 0.86% within a tolerable range).

(Mask Cleaning Resistance)

Comparison was made about cleaning resistance of the light shieldable film 10 in case where the photomask manufactured from the photomask blank was subjected to chemical cleaning or hot water cleaning. Specifically, comparison was made between the photomask blanks in Example 1 and Reference Example 1 and between the photomask blanks in Example 2 and Reference Example 2. In each pair, the light shieldable films 10 were formed under the same conditions except that the molybdenum content of the antireflection layer 13 was different. In the comparison about chemical cleaning, the photomask was cleaned using an ammonia-hydrogen peroxide mixture (mixture ratio<volume ratio>NH$_4$OH:H$_2$O$_2$:H$_2$O=1:1:5). In the comparison about hot water cleaning, cleaning was performed using hot water at 90° C.

In Reference Examples 1 and 2, in either case of chemical cleaning or hot water cleaning, the front-surface antireflection layer was dissolved by photomask cleaning due to a large content of molybdenum. As a result, each of the optical characteristics, the CD, and the sectional shape was changed and degraded beyond the tolerable range.

On the other hand, in Examples 1 and 2, the content of molybdenum was minimized. Therefore, in either case of chemical cleaning or hot water cleaning, dissolution of the front-surface antireflection layer due to photomask cleaning was minimized. The change in each of optical characteristics, CD, and sectional shape was suppressed within the tolerable range.

(Improvement of Positional Accuracy)

Comparison was made about a difference in positional accuracy after manufacture of the photomask in dependence on the film composition of the etching mask film 20 formed on an upper surface of the light shieldable film 10. Specifically, comparison was made between the photomask blanks in Example 1 and Reference Example 1 and between the photomask blanks in Example 2 and Reference Example 2. In each pair, the photomask blanks were formed under the substantially same conditions except that the film composition of the etching mask film 20 was different.

In the photomask blanks in Reference Examples 1 and 2, the film stress (tensile stress) of the etching mask film 20 of CrN was relatively large. Therefore, by peeling the etching mask film 20 after manufacture of the photomask, the change in substrate flatness was about 0.1 μm. It was found that the positional accuracy required in a double pattern of hp 45 nm and beyond is difficult to achieve.

On the other hand, in Examples 1 and 2, the film stress of the etching mask film of CrOCN can be considerably small as compared with CrN. Therefore, the change in substrate flatness as a result of peeling the CrOCN film 20 after manufacture of the photomask was suppressed to about 0.05 μm. Thus, the positional accuracy required in a double pattern of hp 45 nm or beyond was achieved.

As described above, according to this invention, a high-quality photomask adaptable to the 45 nm hp generation, furthermore, the 32 to 22 nm hp generation was obtained.

According to this invention, as regards the resolution of a transfer pattern formed on the photomask, it is possible to resolve a transfer pattern of 50 nm.

Although this invention has so far been described in connection with several examples, the technical scope of this invention is not limited to the foregoing examples. It will readily be understood for those skilled in the art to modify or improve the foregoing examples in various other manners. As clearly understood from the appended claims, such modifications and improvements will be encompassed within the technical scope of this invention.

What is claimed is:

1. A photomask blank for manufacturing a phase shift mask having a light transmitting substrate provided with a phase shift portion adapted to give a predetermined phase difference to transmitted exposure light, wherein the phase shift portion is a dug-down portion that is dug down from a surface of the light transmitting substrate to a digging depth adapted to produce the predetermined phase difference with respect to exposure light transmitted through the light transmitting substrate at a portion where the phase shift portion is not provided, and the photomask blank comprises:

the light transmitting substrate; and a light shieldable film formed on the light transmitting substrate, wherein the light shieldable film comprises:

a light shielding layer which is formed of molybdenum silicide metal having a molybdenum content greater than 20 atomic % and not greater than 40 atomic % and which has a thickness smaller than 40 nm;

an antireflection layer formed on the light shielding layer in contact with the light shielding layer and comprising a molybdenum silicide compound containing at least one of oxygen and nitrogen; and a low reflection layer formed under the light shielding layer in contact with the light shielding layer, wherein the low reflection layer is formed of a material having an etching selectivity for an etching gas used in digging the light transmitting substrate by dry etching and is formed in contact with a dug-down surface of the light transmitting substrate.

2. The photomask blank according to claim 1, wherein the low reflection layer is formed of a material containing one of chromium, chromium nitride, chromium oxide, chromium oxynitride, chromium oxycarbonitride, tantalum-hafnium, and tantalum-zirconium as a main component.

3. The photomask blank according to claim 1, wherein the antireflection layer contains molybdenum in a content greater than 0 atomic % and not greater than 10 atomic %.

4. The photomask blank according to claim 1, further comprising an etching mask film formed on the light shieldable film in contact with the light shieldable film and formed of a material containing chromium as a main component.

5. The photomask blank according to claim 4, wherein the etching mask film is formed of a material containing one of chromium nitride, chromium oxide, chromium oxynitride, and chromium oxycarbonitride as a main component.

6. The photomask blank according to claim 1, wherein the antireflection layer is made of any one of MoSiON, MoSiO, MoSiN, MoSiOC, and MoSiOCN.

7. The photomask blank according to claim 1, wherein the light shieldable film is a heat-treated film.

8. The photomask blank according to claim 1, wherein the antireflection layer has a thickness of 5 nm to 15 nm.

9. The photomask blank according to claim 1, wherein the etching mask film has a thickness of 5 nm to 30 nm.

10. The photomask blank according to claim 1, wherein the low reflection layer has a thickness of 10 nm to 30 nm.

11. A photomask manufactured by using the photomask blank according to claim 1.

12. A method of manufacturing a photomask by using the photomask blank according to claim 1.

13. A photomask blank for manufacturing a phase shift mask having a light transmitting substrate provided with a phase shift portion adapted to give a predetermined phase difference to transmitted exposure light, wherein the phase shift portion is a dug-down portion that is dug down from a surface of the light transmitting substrate to a digging depth adapted to produce the predetermined phase difference with respect to exposure light transmitted through the light transmitting substrate at a portion where the phase shift portion is not provided, and the photomask blank comprises:

the light transmitting substrate; and a light shieldable film formed on the light transmitting substrate, wherein the light shieldable film comprises:
a light shielding layer which is formed of molybdenum silicide metal having a molybdenum content greater than 20 atomic % and not greater than 40 atomic % and which has a thickness smaller than 40 nm;
an antireflection layer formed on the light shielding layer in contact with the light shielding layer and comprising a molybdenum silicide compound containing at least one of oxygen and nitrogen; and
a low reflection layer formed under the light shielding layer in contact with the light shielding layer,
wherein the low reflection layer is formed of a material containing one of chromium, chromium nitride, chromium oxide, chromium oxynitride, chromium oxycarbonitride, tantalum-hafnium, and tantalum-zirconium as a main component and is formed in contact with a dug-down surface of the light transmitting substrate.

14. The photomask blank according to claim 13, wherein the antireflection layer contains molybdenum in a content greater than 0 atomic % and not greater than 10 atomic %.

15. A photomask manufactured by using the photomask blank according to claim 13.

16. A method of manufacturing a photomask by using the photomask blank according to claim 13.

17. A photomask blank for manufacturing a phase shift mask having a light transmitting substrate provided with a phase shift portion adapted to give a predetermined phase difference to transmitted exposure light,
wherein the phase shift portion is a phase shift film adapted to give a predetermined phase change amount to the transmitted exposure light, and
the photomask blank comprises:
the light transmitting substrate;
the phase shift film formed on the light transmitting substrate; and
a light shieldable film formed on the phase shift film,
wherein the light shieldable film comprises:
a light shielding layer which is formed of molybdenum silicide metal having a molybdenum content greater than 20 atomic % and not greater than 40 atomic % and which has a thickness smaller than 40 nm;
an antireflection layer formed on the light shielding layer in contact with the light shielding layer and comprising a molybdenum silicide compound containing at least one of oxygen and nitrogen;
a low reflection layer formed under the light shielding layer in contact with the light shielding layer,
wherein the low reflection layer is formed of a material having an etching selectivity for an etching gas used in dry etching the phase shift film and is formed in contact with a surface of the phase shift film.

18. The photomask blank according to claim 17, wherein the low reflection layer is formed of a material containing one of chromium, chromium nitride, chromium oxide, chromium oxynitride, chromium oxycarbonitride, tantalum-hafnium, and tantalum-zirconium as a main component.

19. The photomask blank according to claim 17, wherein the antireflection layer contains molybdenum in a content greater than 0 atomic % and not greater than 10 atomic %.

20. The photomask blank according to claim 17, further comprising an etching mask film formed on the light shieldable film in contact with the light shieldable film and formed of a material containing chromium as a main component.

21. The photomask blank according to claim 20, wherein the etching mask film is formed of a material containing one of chromium nitride, chromium oxide, chromium oxynitride, and chromium oxycarbonitride as a main component.

22. The photomask blank according to claim 17, wherein the antireflection layer is made of any one of MoSiON, MoSiO, MoSiN, MoSiOC, and MoSiOCN.

23. The photomask blank according to claim 17, wherein the light shieldable film is a heat-treated film.

24. The photomask blank according to claim 17, wherein the antireflection layer has a thickness of 5 nm to 15 nm.

25. The photomask blank according to claim 17, wherein the etching mask film has a thickness of 5 nm to 30 nm.

26. The photomask blank according to claim 17, wherein the low reflection layer has a thickness of 10 nm to 30 nm.

27. A photomask manufactured by using the photomask blank according to claim 17.

28. A method of manufacturing a photomask by using the photomask blank according to claim 17.

29. A photomask blank for manufacturing a phase shift mask having a light transmitting substrate provided with a phase shift portion adapted to give a predetermined phase difference to transmitted exposure light,
wherein the phase shift portion is a phase shift film adapted to give a predetermined phase change amount to the transmitted exposure light, and
the photomask blank comprises:
the light transmitting substrate;
the phase shift film formed on the light transmitting substrate; and
a light shieldable film formed on the phase shift film,
wherein the light shieldable film comprises:
a light shielding layer which is formed of molybdenum silicide metal having a molybdenum content greater than 20 atomic % and not greater than 40 atomic % and which has a thickness smaller than 40 nm;
an antireflection layer formed on the light shielding layer in contact with the light shielding layer and comprising a molybdenum silicide compound containing at least one of oxygen and nitrogen;
a low reflection layer formed under the light shielding layer in contact with the light shielding layer,
wherein the low reflection layer is formed of a material containing one of chromium, chromium nitride, chromium oxide, chromium oxynitride, chromium oxycarbonitride, tantalum-hafnium, and tantalum-zirconium as a main component and is formed in contact with a surface of the phase shift film.

30. The photomask blank according to claim 29, wherein the antireflection layer contains molybdenum in a content greater than 0 atomic % and not greater than 10 atomic %.

31. A photomask manufactured by using the photomask blank according to claim 29.

32. A method of manufacturing a photomask by using the photomask blank according to claim 29.

* * * * *